United States Patent
Lee et al.

(10) Patent No.: US 9,715,102 B2
(45) Date of Patent: Jul. 25, 2017

(54) ELECTROMECHANICAL SYSTEMS DEVICE WITH HINGES FOR REDUCING TILT INSTABILITY

(71) Applicant: Snaptrack, Inc., San Diego, CA (US)

(72) Inventors: Bor-Shiun Lee, New Taipei (TW);
Hung-Yi Lin, New Taipei (TW);
Chih-Chun Lee, Taipei (TW);
Sheng-Yi Hsiao, HsinChu (TW)

(73) Assignee: SnapTrack, Inc., San Diego, CA (US)

(*) Notice: Subject to any disclaimer, the term of this patent is extended or adjusted under 35 U.S.C. 154(b) by 0 days.

(21) Appl. No.: 14/737,101

(22) Filed: Jun. 11, 2015

(65) Prior Publication Data
US 2016/0363761 A1  Dec. 15, 2016

(51) Int. Cl.
| | |
|---|---|
| G02B 26/00 | (2006.01) |
| G02B 26/08 | (2006.01) |
| G02F 1/29 | (2006.01) |
| B81B 7/02 | (2006.01) |
| G06F 3/01 | (2006.01) |
| G06T 1/20 | (2006.01) |
| G09G 5/00 | (2006.01) |

(52) U.S. Cl.
CPC ............ *G02B 26/001* (2013.01); *B81B 7/02* (2013.01); *G06F 3/01* (2013.01); *G06T 1/20* (2013.01); *G09G 5/00* (2013.01); *B81B 2201/042* (2013.01)

(58) Field of Classification Search
USPC ....... 359/290, 291, 295, 298, 237, 245, 251, 359/252, 254, 266, 269, 270, 271; 345/108, 103, 98, 85, 30
See application file for complete search history.

(56) References Cited

U.S. PATENT DOCUMENTS

| 4,954,789 A | 9/1990 | Sampsell |
|---|---|---|
| 7,420,676 B2 | 9/2008 | Lof et al. |
| (Continued) | | |

FOREIGN PATENT DOCUMENTS

EP     1056076 A2    11/2000

OTHER PUBLICATIONS

Rao, M. P. et al., AIP, Applied Physics Letters, *Single-mask three-dimensional microfabrication of high-aspect-ratio structures in bulk silicon using reactive ion etching lag and sacrificial oxidation*, 4 pages.

(Continued)

*Primary Examiner* — Brandi Thomas
(74) *Attorney, Agent, or Firm* — Weaver Austin Villeneuve & Sampson LLP

(57) ABSTRACT

This disclosure provides systems, methods, and apparatus for reducing tilt instability in an electromechanical systems (EMS) device, where the EMS device includes a plurality of hinges supporting a movable mirror over a stationary electrode and having identical hinge lengths. The EMS device can include a plurality of first anchor points providing connection at the substrate and a plurality of second anchor points providing connection at the movable mirror. Each of the hinges can be positioned between paired first and second anchor points and symmetrically arranged about the center of the movable mirror. In some implementations, the plurality of first anchor points and the plurality of second anchor points can be defined by a single mask.

18 Claims, 18 Drawing Sheets

(56) References Cited

U.S. PATENT DOCUMENTS

| | | |
|---|---|---|
| 7,626,752 B2* | 12/2009 | Ogikubo ............ G02B 26/0841 |
| | | 359/290 |
| 7,684,104 B2 | 3/2010 | Chui et al. |
| 7,835,093 B2 | 11/2010 | Wang |
| 2002/0015215 A1 | 2/2002 | Miles |
| 2003/0012231 A1 | 1/2003 | Tayebati et al. |
| 2004/0141224 A1* | 7/2004 | Huibers ............. G02B 26/0833 |
| | | 359/291 |
| 2008/0290430 A1 | 11/2008 | Mahadevan et al. |
| 2012/0055701 A1* | 3/2012 | Rathburn ............... H01R 12/57 |
| | | 174/254 |
| 2014/0092110 A1 | 4/2014 | Chan et al. |
| 2014/0192397 A1* | 7/2014 | Atnip .................. B81C 1/00642 |
| | | 359/291 |
| 2014/0267443 A1 | 9/2014 | Chan et al. |
| 2014/0327948 A1* | 11/2014 | Shi ......................... G02B 26/02 |
| | | 359/230 |
| 2016/0149516 A1 | 5/2016 | Hong et al. |

OTHER PUBLICATIONS

International Search Report and Written Opinion, International Application No. PCT/US2016/031856, dated Sep. 22, 2016.

* cited by examiner

ELECTROMECHANICAL SYSTEMS DEVICE WITH HINGES FOR REDUCING TILT INSTABILITY

TECHNICAL FIELD

This disclosure relates to electromechanical systems (EMS) devices and more particularly to tilt-resistant EMS devices with hinges having substantially identical hinge lengths.

DESCRIPTION OF THE RELATED TECHNOLOGY

Electromechanical systems (EMS) include devices having electrical and mechanical elements, actuators, transducers, sensors, optical components such as mirrors and optical films, and electronics. EMS devices or elements can be manufactured at a variety of scales including, but not limited to, microscales and nanoscales. For example, microelectromechanical systems (MEMS) devices can include structures having sizes ranging from about a micron to hundreds of microns or more. Nanoelectromechanical systems (NEMS) devices can include structures having sizes smaller than a micron including, for example, sizes smaller than several hundred nanometers. Electromechanical elements may be created using deposition, etching, lithography, and/or other micromachining processes that etch away parts of substrates and/or deposited material layers, or that add layers to form electrical and electromechanical devices.

One type of EMS device is called an interferometric modulator (IMOD). The term IMOD or interferometric light modulator refers to a device that selectively absorbs and/or reflects light using the principles of optical interference. In some implementations, an IMOD display element may include a pair of conductive plates, one or both of which may be transparent and/or reflective, wholly or in part, and capable of relative motion upon application of an appropriate electrical signal. For example, one plate may include a stationary layer deposited over, on or supported by a substrate and the other plate may include a reflective membrane separated from the stationary layer by an air gap. The position of one plate in relation to another can change the optical interference of light incident on the IMOD display element. IMOD-based display devices have a wide range of applications, and are anticipated to be used in improving existing products and creating new products, especially those with display capabilities.

Many EMS and MEMS devices apply a voltage to generate an electrostatic attraction between two electrodes to cause one electrode to move in relation to the other electrode. The positions of one or both of the electrodes can become unstable as the electrostatic force between the electrodes increases quadratically with decreasing distance between the electrodes. For example, after a movable electrode travels a certain distance, the movable electrode can quickly travel the remaining separation distance, which is a phenomenon referred to as "snap-through." In addition, tilt can occur if the movable electrode experiences any degree of perturbation, and charge can build up in the area of the tilt that can serve as a positively reinforcing mechanism, which results in tilt instability. Beyond a certain critical travel range, tilting can become unstable and one side or corner of the EMS or MEMS device can snap down.

SUMMARY

The systems, methods and devices of this disclosure each have several innovative aspects, no single one of which is solely responsible for the desirable attributes disclosed herein.

One innovative aspect of the subject matter described in this disclosure can be implemented in an electromechanical systems (EMS) device. The EMS device includes a substrate, a stationary electrode on the substrate, and a movable mirror over the stationary electrode and configured to move across a first gap by electrostatic actuation between the movable mirror and the stationary electrode. The EMS device further includes a plurality of first anchor points equally spaced apart and arranged about the center of the movable mirror, the first anchor points providing connection of the EMS device at the substrate. The EMS device further includes a plurality of second anchor points equally spaced apart and arranged about the center of the movable mirror, the second anchor points providing connection of the EMS device at the movable mirror, each of the first anchor points corresponding to at least one of the second anchor points to define a plurality of paired first and second anchor points. The EMS device further includes a plurality of hinges, each positioned between a distinct one of the plurality of paired first and second anchor points, the plurality of hinges connected to the movable mirror and symmetrically arranged about the center of the EMS device.

In some implementations, each of the hinges has identical or at least substantially identical hinge lengths. In some implementations, each of the plurality of hinges comprises a first metal layer, a second metal layer over the first metal layer, and a dielectric layer between the first metal layer and the second metal layer. In some implementations, the EMS device further includes one or more movable posts, each of the movable posts including a protrusion configured to contact the stationary electrode during electrostatic actuation before the movable mirror contacts the stationary electrode, where the one or more movable posts have a tapered profile. In some implementations, at least part of the plurality of hinges and the movable mirror are coplanar. In some implementations, the plurality of hinges are connected to the substrate at the first anchor points and connected to the movable mirror at the plurality of second anchor points. In some implementations, the EMS device includes a top plate over the movable mirror, where the top plate and the movable mirror define a second gap therebetween. In some implementations, the top plate has substantially the same composition and thickness as the plurality of hinges. In some implementations, the plurality of hinges are connected at the second anchor points at the outermost areas of the movable mirror from the center of the movable mirror. In some implementations, the movable mirror has a front surface facing the substrate and a back surface opposite the front surface, the plurality of hinges suspended over and connected to the back surface of the movable mirror at the plurality of second anchor points. In some implementations, the EMS device further includes a support frame connected to the substrate at the plurality of first anchor points, the support frame around the periphery of the movable mirror.

Another innovative aspect of the subject matter described in this disclosure can be implemented in a method of manufacturing an EMS device. The method includes providing a substrate, forming a first sacrificial layer over the substrate, forming a mirror layer over the first sacrificial layer, and forming a plurality of first vias partially exposing the substrate and equally spaced apart about the center of the EMS device and a plurality of second vias partially exposing the mirror layer and equally spaced apart about the center of the EMS device, each of the first and the second vias being formed by patterning with a single mask, each of the first vias corresponding to at least one of the second vias to define a plurality of paired first and second vias. The method further includes forming a plurality of hinges, each of the hinges between a distinct one of the plurality of paired first and second vias, the hinges connected to the substrate at first anchor points corresponding to the first vias and connected to the mirror layer at second anchor points corresponding to the second vias. The method further includes removing the first sacrificial layer to form a first gap between the mirror layer and the substrate.

In some implementations, the method further includes forming a top plate over the second sacrificial layer simultaneous with forming the plurality of hinges. In some implementations, the method further includes removing the second sacrificial layer simultaneous with removing the first sacrificial layer to form a second gap between the top plate and the mirror layer. In some implementations, each of the hinges has identical or at least substantially identical hinge lengths.

Another innovative aspect of the subject matter described in this disclosure can be implemented in an EMS device. The EMS device includes a substrate, a stationary electrode on the substrate, a movable mirror over the stationary electrode and configured to move across a first gap by electrostatic actuation between the movable mirror and the stationary electrode, and a top plate over the movable mirror and defining a second gap between the movable mirror and the top plate. The EMS device further includes means for reducing tilt instability of the movable mirror and suspending the movable mirror over the stationary electrode.

In some implementations, the EMS device further includes a plurality of first anchor points equally spaced apart and symmetrically arranged about the center of the movable mirror, the first anchor points providing connection of the EMS device at the substrate, and a plurality of second anchor points equally spaced apart and symmetrically arranged about the center of the movable mirror, the second anchor points providing connection of the EMS device at the movable mirror, each of the first anchor points corresponding to at least one of the second anchor points to define a plurality of paired first and second anchor points, where the reducing tilt instability means are each positioned between a distinct one of the plurality of paired first and second anchor points, the reducing tilt instability means connected to the movable mirror and symmetrically arranged about the center of the EMS device.

Details of one or more implementations of the subject matter described in this disclosure are set forth in the accompanying drawings and the description below. Although the examples provided in this disclosure are primarily described in terms of EMS and MEMS-based displays the concepts provided herein may apply to other types of displays such as liquid crystal displays (LCDs), organic light-emitting diode ("OLED") displays, and field emission displays. Other features, aspects, and advantages will become apparent from the description, the drawings and the claims. Note that the relative dimensions of the following figures may not be drawn to scale.

BRIEF DESCRIPTION OF THE DRAWINGS

Like reference numbers and designations in the various drawings indicate like elements.

DETAILED DESCRIPTION

Figure 1:
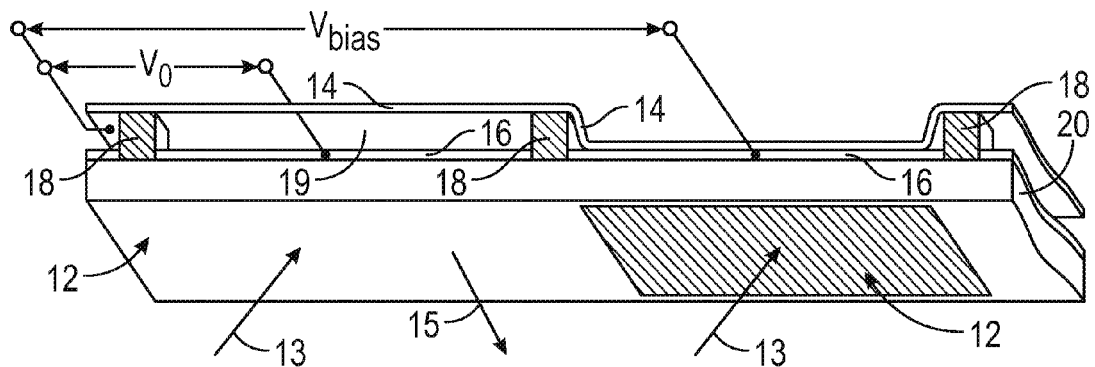
FIG. 1 is an isometric view illustration depicting two adjacent interferometric modulator (IMOD) display elements in a series or array of display elements of an IMOD display device.

The following description is directed to certain implementations for the purposes of describing the innovative aspects of this disclosure. However, a person having ordinary skill in the art will readily recognize that the teachings herein can be applied in a multitude of different ways. The described implementations may be implemented in any device, apparatus, or system that can be configured to display an image, whether in motion (such as video) or stationary (such as still images), and whether textual, graphical or pictorial. More particularly, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (e.g., e-readers), computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, as well as non-EMS applications), aesthetic structures (such as display of images on a piece of jewelry or clothing) and a variety of EMS devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

Some implementations described herein relate to EMS devices including a substrate, a stationary electrode over the substrate, a movable electrode over the stationary electrode, and a plurality of hinges arranged around the movable electrode and supporting the movable electrode. The movable electrode can be part of a movable mirror of the EMS device such that the movable electrode and the mirror are configured to move together. The hinges can have identical hinge lengths, making the movable electrode and mirror more tilt resistant. The EMS device can include a plurality of first anchor points equally spaced apart and providing connection to the EMS device at the substrate. The EMS device can include a plurality of second anchor points equally spaced apart and providing connection to the EMS device at the movable electrode. Each of the hinges can be positioned between the paired first and second anchor points. In some implementations, the plurality of first anchor points and the second anchor points can be defined by a single mask. In some implementations, the EMS device can include a top plate over the movable electrode, where the top plate is formed simultaneously with the hinges. In some implementations, the EMS device can further include a support frame connected to the substrate at the plurality of first anchor points, where the hinges are connected to and supported by the support frame. In some implementations, the EMS device can further include one or more tapered movable posts, each of the tapered movable posts including a protrusion configured to contact the substrate before the movable mirror contacts the substrate during actuation.

Particular implementations of the subject matter described in this disclosure can be implemented to realize one or more of the following potential advantages. An EMS device with identical hinge lengths provides more uniform stiffness around the EMS device. When the movable electrode of the EMS device is driven, the uniform stiffness reduces the effect of tilt instability on the movable electrode. Reducing the effects of tilt instability can increase the stable range of the EMS device. Also, a novel process disclosed herein can fabricate hinges of identical lengths using a single mask. Reducing the number of masks may in turn reduce the number of processing steps and fabrication costs for three-terminal and two-terminal EMS devices. For example, the top plate and the plurality of hinges can be processed simultaneously with a single mask. In some implementations, where the EMS device is used as a pixel in a display, connecting the hinges to a back surface of the mirror can increase the fill factor of the EMS device. The increased fill factor can provide more viewable area in an EMS display device. In some implementations, support frames and/or tapered movable posts can be incorporated in the EMS device to increase the mechanical restoring force of the EMS device and also reduce the effects of tilt instability.

An example of a suitable EMS or MEMS device or apparatus, to which the described implementations may apply, is a reflective display device. Reflective display devices can incorporate interferometric modulator (IMOD) display elements that can be implemented to selectively absorb and/or reflect light incident thereon using principles of optical interference. IMOD display elements can include a partial optical absorber, a reflector (a.k.a. a mirror) that is movable with respect to the absorber, and an optical resonant cavity defined between the absorber and the reflector. In some implementations, the reflector can be moved to two or more different positions, which can change the size of the optical resonant cavity and thereby affect the reflectance of the IMOD. The reflectance spectra of IMOD display elements can create fairly broad spectral bands that can be shifted across the visible wavelengths to generate different colors. The position of the spectral band can be adjusted by changing the thickness of the optical resonant cavity. One way of changing the optical resonant cavity is by changing the position of the reflector with respect to the absorber. However, if the reflector is tilted, the thickness of the optical resonant cavity becomes uneven, causing the color to become off in part of the IMOD. Thus, it is important to design a reflector that is tilt resistant. By adopting at least some of the features disclosed herein, the reflector of the IMOD can be made more resistant to tilting.

FIG. 1 is an isometric view illustration depicting two adjacent interferometric modulator (IMOD) display elements in a series or array of display elements of an IMOD display device. The IMOD display device includes one or more interferometric EMS, such as MEMS, display elements. In these devices, the interferometric MEMS display elements can be configured in either a bright or dark state. In the bright ("relaxed," "open" or "on," etc.) state, the display element reflects a large portion of incident visible light. Conversely, in the dark ("actuated," "closed" or "off," etc.) state, the display element reflects little incident visible light. MEMS display elements can be configured to reflect predominantly at particular wavelengths of light allowing for a color display in addition to black and white. In some implementations, by using multiple display elements, different intensities of color primaries and shades of gray can be achieved.

The IMOD display device can include an array of IMOD display elements which may be arranged in rows and columns. Each display element in the array can include at least a pair of reflective and semi-reflective layers, such as a movable reflective layer (i.e., a movable layer, also referred to as a mechanical layer) and a fixed partially reflective layer (i.e., a stationary layer), positioned at a variable and controllable distance from each other to form an air gap (also referred to as an optical gap, cavity or optical resonant cavity). The movable reflective layer may be moved between at least two positions. For example, in a first position, i.e., a relaxed position, the movable reflective layer can be positioned at a distance from the fixed partially reflective layer. In a second position, i.e., an actuated position, the movable reflective layer can be positioned more closely to the partially reflective layer. Incident light that reflects from the two layers can interfere constructively and/or destructively depending on the position of the movable reflective layer and the wavelength(s) of the incident light, producing either an overall reflective or non-reflective state for each display element. In some implementations, the display element may be in a reflective state when unactuated, reflecting light within the visible spectrum, and may be in a dark state when actuated, absorbing and/or destructively interfering light within the visible range. In some other implementations, however, an IMOD display element may be in a dark state when unactuated, and in a reflective state when actuated. In some implementations, the introduction of an applied voltage can drive the display elements to change states. In some other implementations, an applied charge can drive the display elements to change states.

The depicted portion of the array in FIG. 1 includes two adjacent interferometric MEMS display elements in the form of IMOD display elements 12. In the display element 12 on the right (as illustrated), the movable reflective layer 14 is illustrated in an actuated position near, adjacent or touching the optical stack 16. The voltage $V_{bias}$ applied across the display element 12 on the right is sufficient to move and also maintain the movable reflective layer 14 in the actuated position. In the display element 12 on the left (as illustrated), a movable reflective layer 14 is illustrated in a relaxed position at a distance (which may be predetermined based on design parameters) from an optical stack 16, which includes a partially reflective layer. The voltage $V_0$ applied across the display element 12 on the left is insufficient to cause actuation of the movable reflective layer 14 to an actuated position such as that of the display element 12 on the right.

In FIG. 1, the reflective properties of IMOD display elements 12 are generally illustrated with arrows indicating light 13 incident upon the IMOD display elements 12, and light 15 reflecting from the display element 12 on the left. Most of the light 13 incident upon the display elements 12 may be transmitted through the transparent substrate 20, toward the optical stack 16. A portion of the light incident upon the optical stack 16 may be transmitted through the partially reflective layer of the optical stack 16, and a portion will be reflected back through the transparent substrate 20. The portion of light 13 that is transmitted through the optical stack 16 may be reflected from the movable reflective layer 14, back toward (and through) the transparent substrate 20. Interference (constructive and/or destructive) between the light reflected from the partially reflective layer of the optical stack 16 and the light reflected from the movable reflective layer 14 will determine in part the intensity of wavelength(s) of light 15 reflected from the display element 12 on the viewing or substrate side of the device. In some implementations, the transparent substrate 20 can be a glass substrate (sometimes referred to as a glass plate or panel). The glass substrate may be or include, for example, a borosilicate glass, a soda lime glass, quartz, Pyrex®, or other suitable glass material. In some implementations, the glass substrate may have a thickness of 0.3, 0.5 or 0.7 millimeters, although in some implementations the glass substrate can be thicker (such as tens of millimeters) or thinner (such as less than 0.3 millimeters). In some implementations, a non-glass substrate can be used, such as a polycarbonate, acrylic, polyethylene terephthalate (PET) or polyether ether ketone (PEEK) substrate. In such an implementation, the non-glass substrate will likely have a thickness of less than 0.7 millimeters, although the substrate may be thicker depending on the design considerations. In some implementations, a non-transparent substrate, such as a metal foil or stainless steel-based substrate can be used. For example, a reverse-IMOD-based display, which includes a fixed reflective layer and a movable layer which is partially transmissive and partially reflective, may be configured to be viewed from the opposite side of a substrate as the display elements 12 of FIG. 1 and may be supported by a non-transparent substrate.

The optical stack 16 can include a single layer or several layers. The layer(s) can include one or more of an electrode layer, a partially reflective and partially transmissive layer, and a transparent dielectric layer. In some implementations, the optical stack 16 is electrically conductive, partially transparent and partially reflective, and may be fabricated, for example, by depositing one or more of the above layers onto a transparent substrate 20. The electrode layer can be formed from a variety of materials, such as various metals, for example indium tin oxide (ITO). The partially reflective layer can be formed from a variety of materials that are partially reflective, such as various metals (e.g., chromium and/or molybdenum), semiconductors, and dielectrics. The partially reflective layer can be formed of one or more layers of materials, and each of the layers can be formed of a single material or a combination of materials. In some implementations, certain portions of the optical stack 16 can include a single semi-transparent thickness of metal or semiconductor which serves as both a partial optical absorber and electrical conductor, while different, electrically more conductive layers or portions (e.g., of the optical stack 16 or of other structures of the display element) can serve to bus signals between IMOD display elements. The optical stack 16 also can include one or more insulating or dielectric layers covering one or more conductive layers or an electrically conductive/partially absorptive layer.

In some implementations, at least some of the layer(s) of the optical stack 16 can be patterned into parallel strips, and may form row electrodes in a display device as described further below. As will be understood by one having ordinary skill in the art, the term "patterned" is used herein to refer to masking as well as etching processes. In some implementations, a highly conductive and reflective material, such as aluminum (Al), may be used for the movable reflective layer 14, and these strips may form column electrodes in a display device. The movable reflective layer 14 may be formed as a series of parallel strips of a deposited metal layer or layers (orthogonal to the row electrodes of the optical stack 16) to form columns deposited on top of supports, such as the illustrated posts 18, and an intervening sacrificial material located between the posts 18. When the sacrificial material is etched away, a defined gap 19, or optical cavity, can be formed between the movable reflective layer 14 and the optical stack 16. In some implementations, the spacing between posts 18 may be approximately 1-1000 µm, while the gap 19 may be approximately less than 10,000 Angstroms (Å).

In some implementations, each IMOD display element, whether in the actuated or relaxed state, can be considered as a capacitor formed by the fixed and moving reflective layers. When no voltage is applied, the movable reflective layer 14 remains in a mechanically relaxed state, as illustrated by the display element 12 on the left in FIG. 1, with the gap 19 between the movable reflective layer 14 and optical stack 16. However, when a potential difference, i.e., a voltage, is applied to at least one of a selected row and column, the capacitor formed at the intersection of the row and column electrodes at the corresponding display element becomes charged, and electrostatic forces pull the electrodes together. If the applied voltage exceeds a threshold, the movable reflective layer 14 can deform and move near or against the optical stack 16. A dielectric layer (not shown) within the optical stack 16 may prevent shorting and control the separation distance between the layers 14 and 16, as illustrated by the actuated display element 12 on the right in FIG. 1. The behavior can be the same regardless of the polarity of the applied potential difference. Though a series of display elements in an array may be referred to in some instances as "rows" or "columns," a person having ordinary skill in the art will readily understand that referring to one direction as a "row" and another as a "column" is arbitrary. Restated, in some orientations, the rows can be considered columns, and the columns considered to be rows. In some implementations, the rows may be referred to as "common" lines and the columns may be referred to as "segment" lines, or vice versa. Furthermore, the display elements may be evenly arranged in orthogonal rows and columns (an "array"), or arranged in non-linear configurations, for example, having certain positional offsets with respect to one another (a "mosaic"). The terms "array" and "mosaic" may refer to either configuration. Thus, although the display is referred to as including an "array" or "mosaic," the elements themselves need not be arranged orthogonally to one another, or disposed in an even distribution, in any instance, but may include arrangements having asymmetric shapes and unevenly distributed elements.

Figure 2:
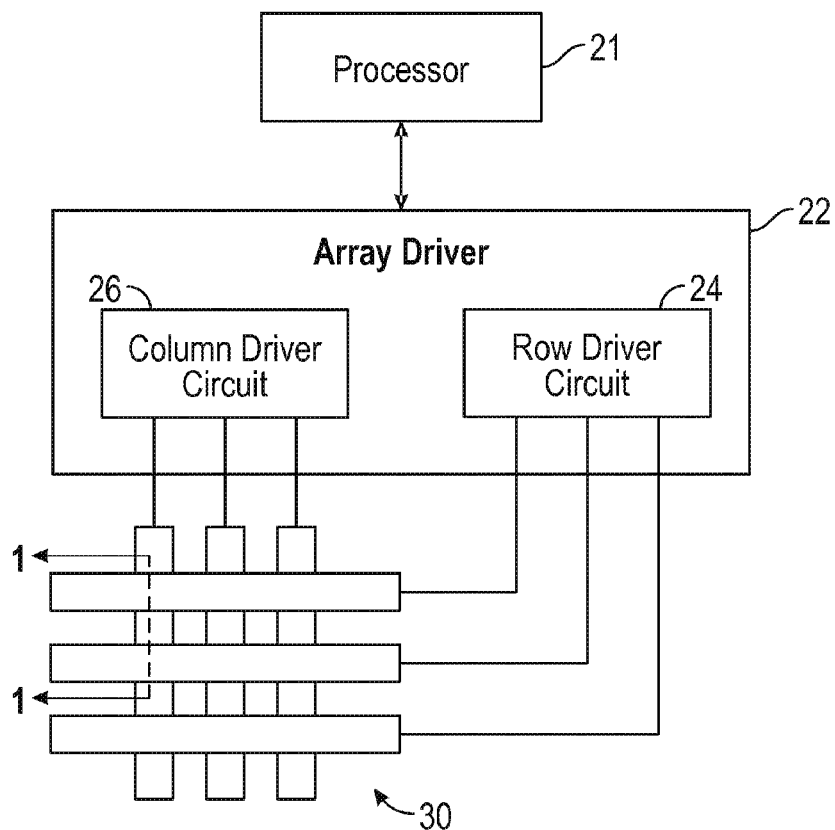
FIG. 2 is a system block diagram illustrating an electronic device incorporating an IMOD-based display including a three element by three element array of IMOD display elements.

FIG. 2 is a system block diagram illustrating an electronic device incorporating an IMOD-based display including a three element by three element array of IMOD display elements. The electronic device includes a processor 21 that may be configured to execute one or more software modules. In addition to executing an operating system, the processor 21 may be configured to execute one or more software applications, including a web browser, a telephone application, an email program, or any other software application.

The processor 21 can be configured to communicate with an array driver 22. The array driver 22 can include a row driver circuit 24 and a column driver circuit 26 that provide signals to, for example a display array or panel 30. The cross section of the IMOD display device illustrated in FIG. 1 is shown by the lines 1-1 in FIG. 2. Although FIG. 2 illustrates a 3×3 array of IMOD display elements for the sake of clarity, the display array 30 may contain a very large number of IMOD display elements, and may have a different number of IMOD display elements in rows than in columns, and vice versa. The array driver 22 and the row driver circuit 24 may provide signals for actuating a movable mirror for an IMOD display element, where the movable mirror during actuation may be more tilt resistant in the present disclosure.

Figure 3A:
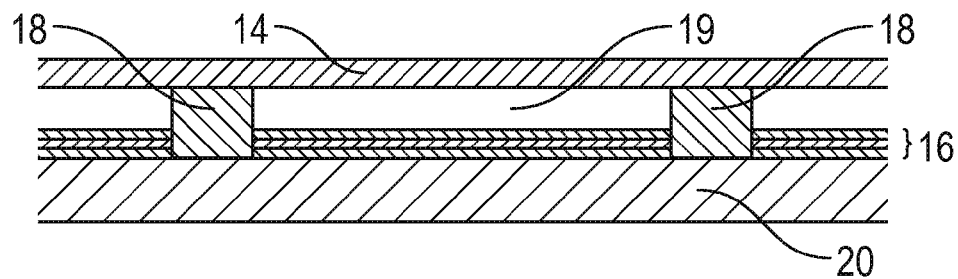
FIGS. 3A-3E are cross-sectional illustrations of varying implementations of IMOD display elements.
Figure 3B:
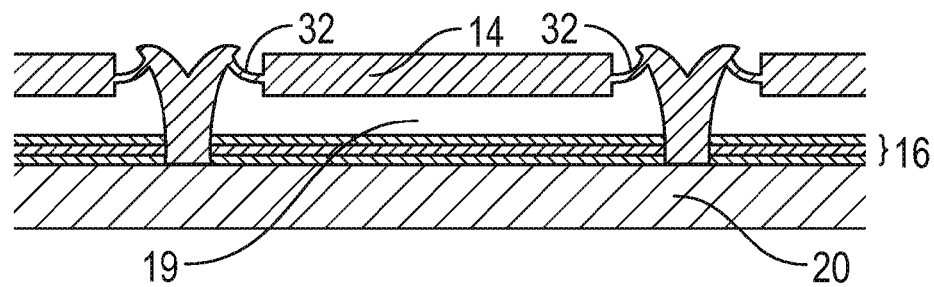
Figure 3C:
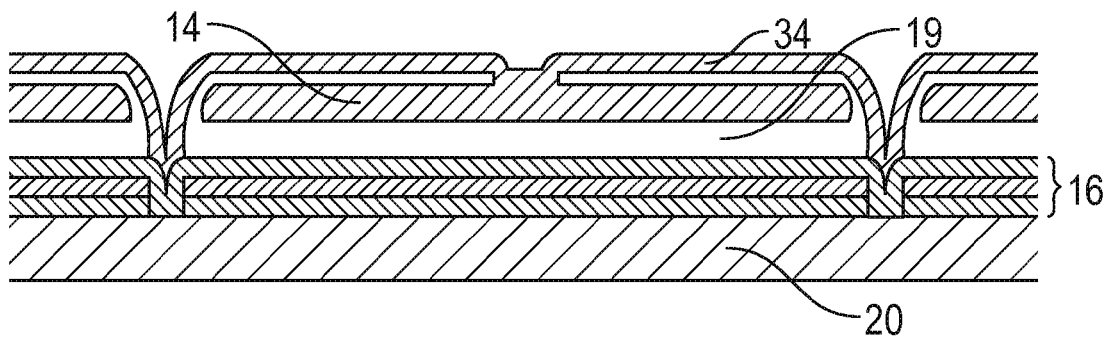

The details of the structure of IMOD displays and display elements may vary widely. FIGS. 3A-3E are cross-sectional illustrations of varying implementations of IMOD display elements. FIG. 3A is a cross-sectional illustration of an IMOD display element, where a strip of metal material is deposited on supports 18 extending generally orthogonally from the substrate 20 forming the movable reflective layer 14. In FIG. 3B, the movable reflective layer 14 of each IMOD display element is generally square or rectangular in shape and attached to supports at or near the corners, on tethers 32. In FIG. 3C, the movable reflective layer 14 is generally square or rectangular in shape and suspended from a deformable layer 34, which may include a flexible metal. The deformable layer 34 can connect, directly or indirectly, to the substrate 20 around the perimeter of the movable reflective layer 14. These connections are herein referred to as implementations of "integrated" supports or support posts 18. The implementation shown in FIG. 3C has additional benefits deriving from the decoupling of the optical functions of the movable reflective layer 14 from its mechanical functions, the latter of which are carried out by the deformable layer 34. This decoupling allows the structural design and materials used for the movable reflective layer 14 and those used for the deformable layer 34 to be optimized independently of one another.

Figure 3D:
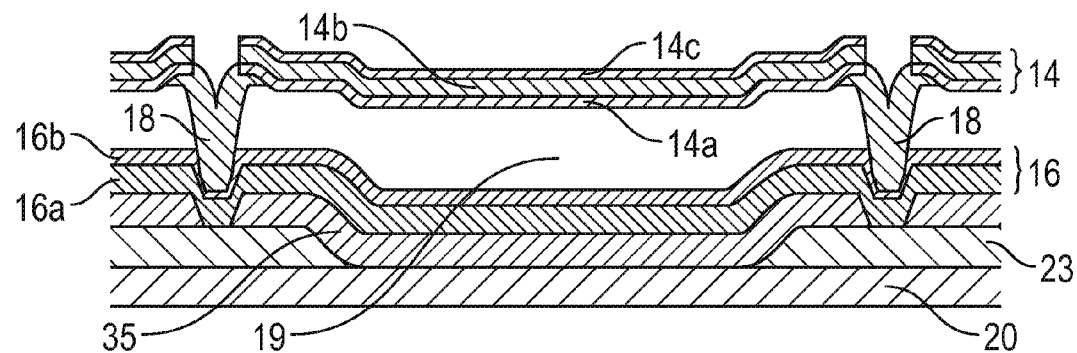

FIG. 3D is another cross-sectional illustration of an IMOD display element, where the movable reflective layer 14 includes a reflective sub-layer 14a. The movable reflective layer 14 rests on a support structure, such as support posts 18. The support posts 18 provide separation of the movable reflective layer 14 from the lower stationary electrode, which can be part of the optical stack 16 in the illustrated IMOD display element. For example, a gap 19 is formed between the movable reflective layer 14 and the optical stack 16, when the movable reflective layer 14 is in a relaxed position. The movable reflective layer 14 also can include a conductive layer 14c, which may be configured to serve as an electrode, and a support layer 14b. In this example, the conductive layer 14c is disposed on one side of the support layer 14b, distal from the substrate 20, and the reflective sub-layer 14a is disposed on the other side of the support layer 14b, proximal to the substrate 20. In some implementations, the reflective sub-layer 14a can be conductive and can be disposed between the support layer 14b and the optical stack 16. The support layer 14b can include one or more layers of a dielectric material, for example, silicon oxynitride (SiON) or silicon dioxide ($SiO_2$). In some implementations, the support layer 14b can be a stack of layers, such as, for example, a $SiO_2$/SiON/$SiO_2$ tri-layer stack. Either or both of the reflective sub-layer 14a and the conductive layer 14c can include, for example, an aluminum (Al) alloy with about 0.5% copper (Cu), or another reflective metallic material. Employing conductive layers 14a and 14c above and below the dielectric support layer 14b can balance stresses and provide enhanced conduction. In some implementations, the reflective sub-layer 14a and the conductive layer 14c can be formed of different materials for a variety of design purposes, such as achieving specific stress profiles within the movable reflective layer 14.

As illustrated in FIG. 3D, some implementations also can include a black mask structure 23, or dark film layers. The black mask structure 23 can be formed in optically inactive regions (such as between display elements or under the support posts 18) to absorb ambient or stray light. The black mask structure 23 also can improve the optical properties of a display device by inhibiting light from being reflected from or transmitted through inactive portions of the display, thereby increasing the contrast ratio. Additionally, at least some portions of the black mask structure 23 can be conductive and be configured to function as an electrical bussing layer. In some implementations, the row electrodes can be connected to the black mask structure 23 to reduce the resistance of the connected row electrode. The black mask structure 23 can be formed using a variety of methods, including deposition and patterning techniques. The black mask structure 23 can include one or more layers. In some implementations, the black mask structure 23 can be an etalon or interferometric stack structure. For example, in some implementations, the interferometric stack black mask structure 23 includes a molybdenum-chromium (MoCr) layer that serves as an optical absorber, an $SiO_2$ layer, and an aluminum alloy that serves as a reflector and a bussing layer, with a thickness in the range of about 30-80 Å, 500-1000 Å, and 500-6000 Å, respectively. The one or more layers can be patterned using a variety of techniques, including photolithography and dry etching, including, for example, tetrafluoromethane (or carbon tetrafluoride, $CF_4$) and/or oxygen ($O_2$) for the MoCr and $SiO_2$ layers and chlorine ($Cl_2$) and/or boron trichloride ($BCl_3$) for the aluminum alloy layer. In such interferometric stack black mask structures 23, the conductive absorbers can be used to transmit or bus signals between lower, stationary electrodes in the optical stack 16 of each row or column. In some implementations, a spacer layer 35 can serve to generally electrically isolate electrodes (or conductors) in the optical stack 16 (such as the absorber layer 16a) from the conductive layers in the black mask structure 23.

Figure 3E:
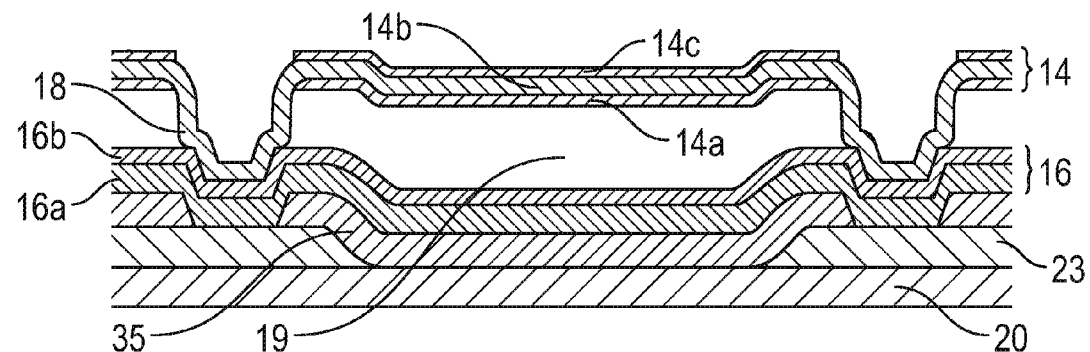

FIG. 3E is another cross-sectional illustration of an IMOD display element, where the movable reflective layer 14 is self-supporting. While FIG. 3D illustrates support posts 18 that are structurally and/or materially distinct from the movable reflective layer 14, the implementation of FIG. 3E includes support posts that are integrated with the movable reflective layer 14. In such an implementation, the movable reflective layer 14 contacts the underlying optical stack 16 at multiple locations, and the curvature of the movable reflective layer 14 provides sufficient support that the movable reflective layer 14 returns to the unactuated position of FIG. 3E when the voltage across the IMOD display element is insufficient to cause actuation. In this way, the portion of the movable reflective layer 14 that curves or bends down to contact the substrate or optical stack 16 may be considered an "integrated" support post. One implementation of the optical stack 16, which may contain a plurality of several different layers, is shown here for clarity including an optical absorber 16a, and a dielectric 16b. In some implementations, the optical absorber 16a may serve both as a stationary electrode and as a partially reflective layer. In some implementations, the optical absorber 16a can be an order of magnitude thinner than the movable reflective layer 14. In some implementations, the optical absorber 16a is thinner than the reflective sub-layer 14a.

Aspects of the implementations shown in FIGS. 3A-3E can be part of the EMS device of the present disclosure. For example, a movable reflective layer 14 can be incorporated in the EMS device of the present disclosure, where the movable reflective layer 14 can include one or more sub-layers. Also, the movable reflective layer 14 can be supported by tethers 32, deformable layer 34, and/or support posts 18. In some implementations, hinges as discussed below may include the tethers 32, deformable layer 34, and/or support posts 18. Though the movable reflective layer 14 in FIGS. 3A-3E may be subject to tilt instability, the EMS device of the present disclosure may include a more tilt-resistant movable reflective layer 14 supported by one or more hinges.

In implementations such as those shown in FIGS. 3A-3E, the IMOD display elements form a part of a direct-view device, in which images can be viewed from the front side of the transparent substrate 20, which in this example is the side opposite to that upon which the IMOD display elements are formed. In these implementations, the back portions of the device (that is, any portion of the display device behind the movable reflective layer 14, including, for example, the deformable layer 34 illustrated in FIG. 3C) can be configured and operated upon without impacting or negatively affecting the image quality of the display device, because the reflective layer 14 optically shields those portions of the device. For example, in some implementations a bus structure (not illustrated) can be included behind the movable reflective layer 14 that provides the ability to separate the optical properties of the modulator from the electromechanical properties of the modulator, such as voltage addressing and the movements that result from such addressing.

For many EMS and MEMS devices, a voltage can be applied to generate an electrostatic attraction between two electrodes of the device. The electrostatic force between the two electrodes is inversely proportional to separation distance between the two electrodes, and increases quadratically as the separation distance decreases. As a movable electrode is driven towards a stationary electrode, the movable electrode can become unstable after the movable electrode travels a certain distance, and the movable electrode can travel the remaining separation distance more quickly. This phenomenon can be referred to as "snap-through."

Moreover, if the movable electrode tilts by even the slightest degree, which can be caused by the slightest perturbation, charge can build up in the area of the tilt, and as a result, leading to a positively reinforcing mechanism. This mechanism contributes to tilt instability of the movable electrode. The tilt instability can result from any asymmetry in the EMS device, including uneven hinge length. Thus, beyond a certain critical travel range or tilt angle, the tilting becomes unstable and one side or corner of the device can snap-through. For example, after the movable electrode travels half of the distance between two electrodes, the tilting can become unstable in the EMS device and one side or corner of the EMS device can snap-through. The distance between two electrodes, such as movable electrode and the stationary electrode, can be referred to as an "electrical gap."

Issues like tilt instability and snap-through can limit the stable range of EMS devices. Some EMS devices may include optical devices, such as IMODs, as discussed earlier herein. By way of an example, an IMOD can have a stable range from an initial separation distance between electrodes at about 540 nm (e.g., green) to about 360 nm (e.g., red). Hence, the IMOD can tune continuously within the red-green-blue (RGB) color spectrum from about 360 nm to about 540 nm. In another example, an IMOD can have a stable range from an initial separation distance between electrodes at about 350 nm (e.g., blue), to about 250 nm (e.g., red), and to about 170 nm (e.g., green). Hence, the IMOD can tune continuously within the color spectrum from about 350 nm to about 170 nm. It will be understood that the standard ranges of gap sizes for color generation may vary depending on the design of the IMOD. When the movable electrode exceeds a certain critical travel range or tilt angle, the movable electrode may become unstable and snap-through towards the stationary electrode. This can create an unstable region for various wavelengths of light, such as black, making tuning difficult within this region. Even if some IMODs try to extend the stable region by driving with charge instead of voltage, or add a capacitor in series, such configurations of IMODs can still be subject to tilt instability.

In some instances, tilt instability can at least be partially attributed to uneven hinge lengths. Hinges of an EMS device can be connected to the movable electrode and support the movable electrode, where the hinges can provide a mechanical restoring torque to counteract the positively reinforcing mechanism. However, when the hinges are uneven in length, then each of the hinges effectively has a different stiffness that contributes to tilt instability during driving of the movable electrode.

Figure 4A:
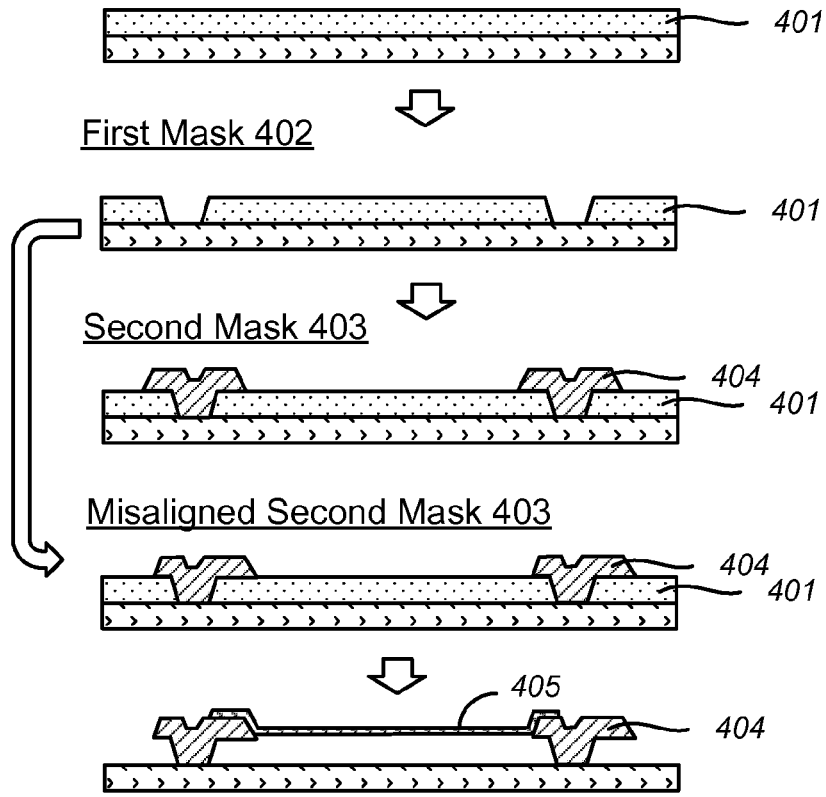
FIGS. 4A and 4B show cross-sectional schematic diagrams illustrating various stages of manufacturing EMS devices using multiple masks for defining the hinges.
Figure 4B:
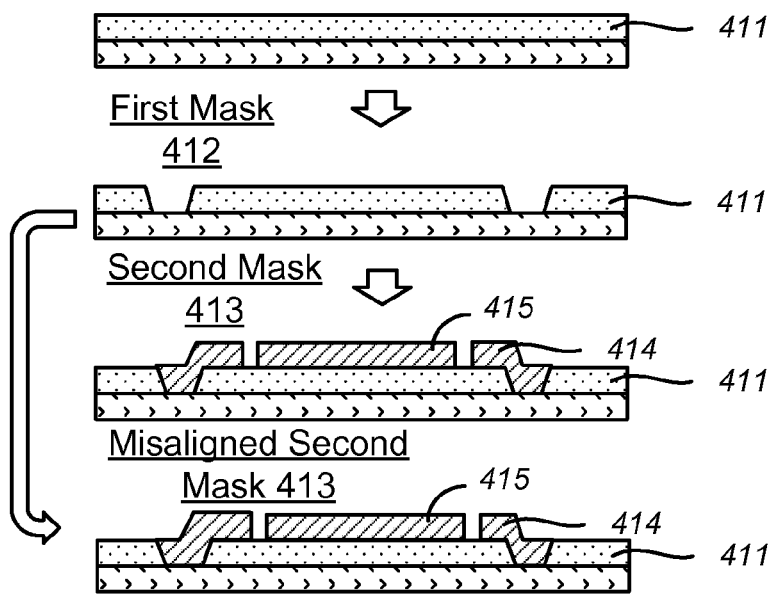

Uneven hinge lengths can result from misalignment of masks during the fabrication of the hinges. FIGS. 4A and 4B show cross-sectional schematic diagrams illustrating various stages of manufacturing EMS devices using multiple masks for defining the hinges. In FIG. 4A, a first mask 402 is applied to a sacrificial layer 401 to etch through the sacrificial layer 401 for positioning hinges 404. In some implementations, the hinges 404 can include support posts or be referred to as support posts. After material is deposited on the sacrificial layer 401 for forming the hinges 404, a second mask 403 is applied for patterning the hinges 404. If there is any misalignment between the first mask 402 and the second mask 403, the dimensions of the hinges 404 may be uneven. As shown in FIG. 4A, the left hinge length is longer than the right hinge length, resulting in different stiffnesses. The difference in stiffness can lead to a less tilt-resistant movable mirror 405. In FIG. 4B, a first mask 412 is applied to a sacrificial layer 411 to etch through the sacrificial layer 411 for positioning hinges 414. After material is deposited on the sacrificial layer for forming the mirror layer 415, a second mask 413 is applied for patterning the mirror layer 415 and the hinges 414. Again, if there is any misalignment between the first mask 412 and the second mask 413, the dimensions of the hinges 414 may be uneven. As shown in FIG. 4B, the left hinge length is longer than the right hinge length, resulting in different stiffnesses. The difference in stiffness can lead to a less tilt-resistant movable mirror 415.

In some implementations, a single mask can define the lateral dimensions of the hinges so that the hinges may have identical lateral dimensions (e.g., length). Having identical lateral dimensions or at least substantially identical lateral dimensions enables uniform or at least substantially uniform stiffness for each of the hinges. Typical mask alignment capabilities can be within about 1% tolerance, so hinges that are 30 μm long can be within about ±0.3 μm of each other. A single mask can provide hinge lengths with no such deviation, or at least a deviation much smaller than typical mask alignment capabilities. In some implementations, substantially identical lateral dimensions can refer to dimensions that are less than about 0.5% or less than about 0.1% different from each other. To obtain at least substantially identical hinge dimensions, a single mask can be used to define connection points of the EMS device to the movable electrode (e.g., mirror) and connection points of the EMS device to the substrate. In some implementations, such connection points can be connection points to the hinges, so that hinge-to-mirror and hinge-to-substrate connections can be defined by a single mask.

Figure 5A:
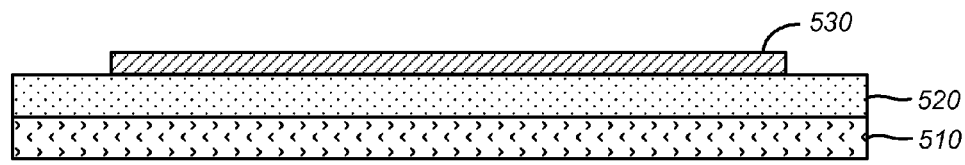
FIGS. 5A-5E show cross-sectional schematic diagrams illustrating various stages of manufacturing an example EMS device using a single mask for defining the hinges.

FIGS. 5A-5E show cross-sectional schematic diagrams illustrating various stages of manufacturing an example EMS device using a single mask for defining the hinges. In FIG. 5A, a partially fabricated EMS device can include a substrate 510. A first sacrificial layer 520 is formed over the substrate 510 and a mirror 530 is formed over the first sacrificial layer 520. The mirror 530 can include a reflective layer or a reflective stack, and an electrode movable with the mirror 530. At a later stage in manufacturing (to be discussed further below), the sacrificial layer 520 will be removed, leaving the mirror 530 suspended over the substrate 510 with a gap between the mirror 530 and the substrate 510. As a result, the mirror 530 can move towards the substrate 510 upon application of an electrostatic force. Thus, the mirror 530 and the electrode of the mirror 530 are commonly referred to as a movable mirror and a movable electrode, respectively. In some implementations, a stationary electrode (not shown) can be disposed on the substrate 510 so that the stationary electrode is between the substrate 510 and the first sacrificial layer 520, or the stationary electrode can be part of the substrate 510 itself.

Figure 5B:
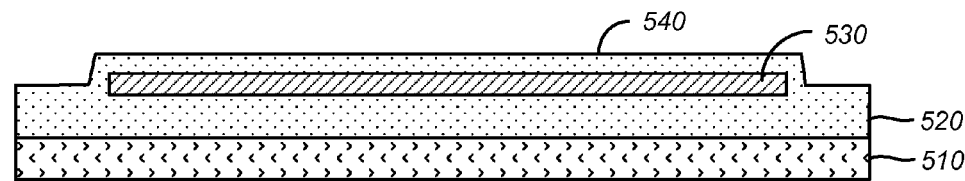

In FIG. 5B, a second sacrificial layer 540 can be formed over the mirror 530. In some implementations, the second sacrificial layer 540 can be made of the same material as the first sacrificial layer 520. In some implementations, the second sacrificial layer 540 can be made of a different material than the first sacrificial layer 520.

Figure 5C:
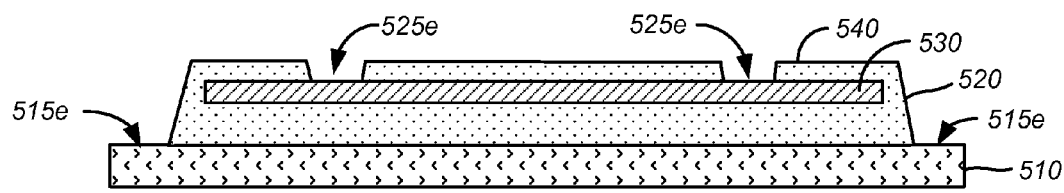

In FIG. 5C, a first mask can be applied for defining a plurality of anchor points for providing connections to the substrate 510 and connections to the mirror 530. In some implementations, the anchor points can provide hinge-to-mirror connections and hinge-to-substrate connections. The first mask can be applied to form a plurality of first vias 515e exposing a portion of the substrate 510 and a plurality of second vias 525e exposing a portion of the mirror 530. The first vias 515e can be formed simultaneous with the second vias 525e. The first vias 515e may be symmetrically arranged about the center of the EMS device and the second vias 525e also may be symmetrically arranged about the center of the EMS device. The second vias 525e may be formed at the back surface of the mirror 530, where the mirror 530 can include a front surface facing the substrate 510 and a back surface opposite the front surface. In some implementations, the first vias 515e and the second vias 525e are formed and patterned using a single mask.

The first vias 515e may be formed by etching through the first sacrificial layer 520 and the second sacrificial layer 540. The second vias 525e may be formed by etching through the second sacrificial layer 540. Each of the first vias 515e can correspond to at least one of the second vias 525e to define a plurality of paired first and second vias. For example, the first via 515e and the second via 525e on the left side may be paired with each other while the first via 515e and the second via 525e on the right side may be paired with each other. The distance between the paired vias may be identical with application of a single mask.

Figure 5D:
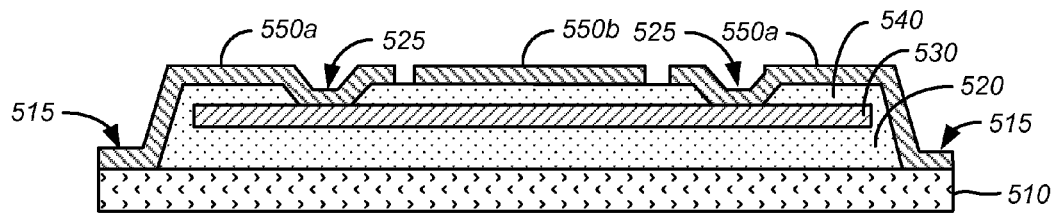

In FIG. 5D, a plurality of hinges 550a may be formed where the hinges 550a are connected to the substrate 510 at first anchor points 515 and connected to the mirror 530 at second anchor points 525. The first anchor points 515 can represent connections of the EMS device to the substrate 510, such as hinge-to-substrate connections, and can correspond to the first vias 515e in FIG. 5C. The plurality of first anchor points 515 can be equally spaced apart from one another. The second anchor points 525 can represent connections of the EMS device to the mirror 530, such as hinge-to-mirror connections, and can correspond to the second vias 525e in FIG. 5C. The plurality of second anchor points 525 can be equally spaced apart from one another. Each of the first anchor points 515 can correspond to at least one of the second anchor points 525 to define a plurality of paired first and second anchor points. For example, the first anchor point 515 and the second anchor point 525 on the left side may be paired with each other while the first anchor point 515 and the second anchor point 525 on the right side may be paired with each other.

In some implementations, the hinges 550a may be referred to as tethers or support structures. The hinges 550a may have identical or at least substantially identical hinge lengths. The hinges 550a may be formed between paired first and second anchor points. In some implementations, hinge length may be defined between paired first and second anchor points. In some implementations, the hinges 550a may be symmetrically arranged about the center of EMS device. The hinges 550a may support the mirror 530 and, in some implementations, are suspended over the mirror 530. As shown in FIG. 5D, the hinges 550a are connected to the mirror 530 at the back surface of the mirror 530. In some implementations, the hinges 550a may include one or more metals, such as aluminum (Al) and titanium (Ti), or other materials such as silicon (Si), oxides, nitrides, and oxynitrides. In some implementations, the hinges 550a may include a tri-layer stack, such as a first metal layer, a second metal layer over the first metal layer, and a dielectric layer between the first metal layer and the second metal layer.

In some implementations, a top plate 550b may be formed over the second sacrificial layer 540 simultaneous with forming the plurality of hinges 550a. Forming the top plate 550b and the hinges 550a can include depositing a layer of material over the second sacrificial layer 540 as well as in the first vias 515e and the second vias 525e. A second mask can be applied to pattern the layer of material so that hinges 550a are formed to support the mirror 530, and the top plate 550b is formed over the mirror 530. Thus, the top plate 550b may share substantially the same composition and thickness as the plurality of hinges 550a because they can be formed from the same layer or layers of material. This can simplify processing of the EMS device. Also this can allow for a larger release path when removing the first sacrificial layer 520 and the second sacrificial layer 540, as the top plate 550b is not separately provided that could otherwise cover more area over the mirror 530, including any release holes.

Figure 5E:
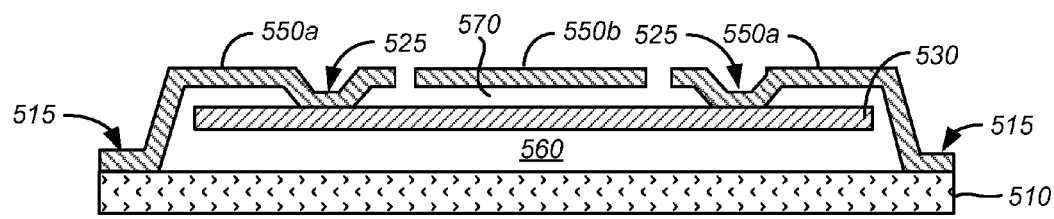

In FIG. 5E, the first sacrificial layer 520 may be removed to form a first gap 560 between the mirror 530 and the substrate 510. The second sacrificial layer 540 may be removed simultaneously with the first sacrificial layer 520 to form a second gap 570 between the top plate 550b and the mirror 530. Removal of the first sacrificial layer 520 and the second sacrificial layer 540 may occur using any suitable etchant. Upon removal of the sacrificial layers 520 and 540, the partially fabricated EMS device can be "released." The mirror 530 may move across the first gap 560 by electrostatic actuation between the movable mirror 530 and the stationary electrode. In some implementations, the top plate 550b over the movable mirror 530 may serve as an electrode. The electrode can apply a voltage, which creates an electrostatic force on the mirror 530 to move the mirror across the second gap 570 towards the top plate 550b. Thus, the implementation of the EMS device in FIG. 5E can represent a three-terminal EMS device, the stationary electrode, the movable mirror 530, and the top plate 550b each serving as a terminal.

In some implementations, the EMS device can further include a stiffening layer (not shown) disposed on the top plate 550b, where a thickness of the stiffening layer can be greater than a thickness of the top plate 550b. The stiffening layer can be added to the top plate 550b to increase the thickness of the top plate 550b to further reinforce and protect the top plate 550b. Especially if the material of the top plate 550b is too soft or the top plate 550b is too thin, the stiffening layer can reinforce support to the top plate 550b. In some implementations, additional circuitry and/or thin film transistors (TFTs) may be formed on the stiffening layer, where the additional circuitry and TFTs may control the movements of the mirror 530. In some other implementations, the additional circuitry and/or TFTs may be formed on the top plate 550b without the stiffening layer.

The hinges 550a may be capable of deflection when the movable mirror 530 moves in the first gap 560 or the second gap 570. When the movable electrode 530 moves across the first gap 560 or the second gap 570, the movable electrode 530 may be subject to tilt instability. The hinges 550a may provide a mechanical restoring torque to counteract the positively reinforcing mechanism resulting from tilt instability. Depending on factors like the position of the hinges 550a, the geometry of the hinges 550a, and the length of the hinges 550a, tilt instability can be reduced. Regarding the length of the hinges 550a, providing identical or at least substantially identical hinge lengths can reduce tilt instability. Put another way, the movable mirror 530 can become more tilt resistant. Moreover, regarding the position of the hinges 550a, providing the hinges 550a further away from the center of the movable mirror 530 also can reduce tilt instability and cause the movable mirror 530 to be more tilt resistant. For example, attaching hinges 550a at the periphery of the movable mirror 530 increases tilt resistance than attaching hinges 550a closer to the center of the movable mirror 530, and attaching hinges 550a at the corners of the movable mirror 530 further increases tilt resistance than attaching hinges 550a at the edges of the movable mirror 530.

Figure 6:
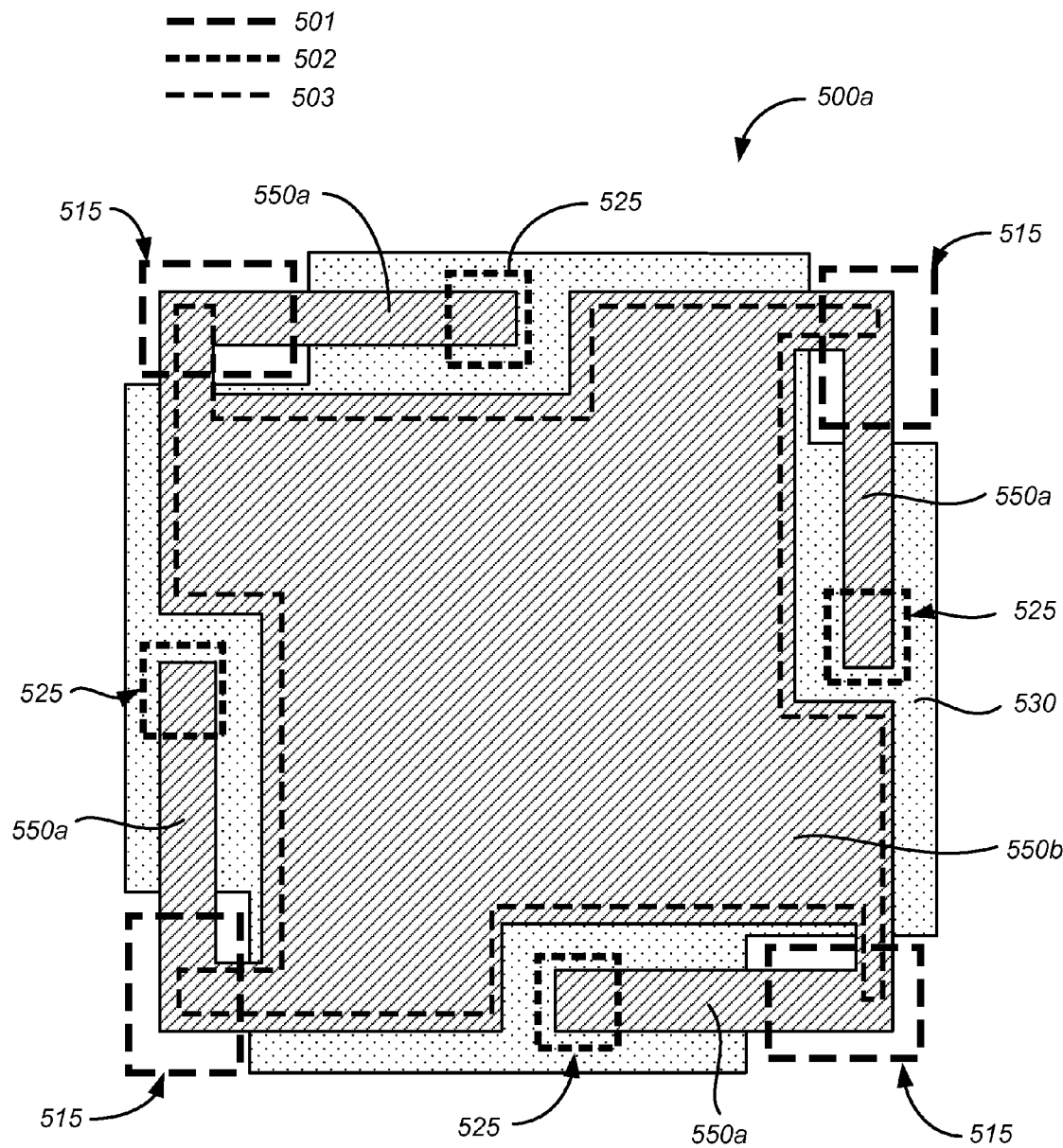
FIG. 6 shows a schematic top plan view of an example EMS device with hinge-to-mirror anchor points at a periphery of a movable mirror.

FIG. 6 shows a schematic top plan view of an example EMS device with hinge-to-mirror anchor points at a periphery of a movable mirror. In some implementations, a cross-section of the EMS device 500a in FIG. 6 can be the EMS device illustrated in FIG. 5E. The EMS device 500a can include a top plate 550b over a movable mirror 530, where the movable mirror 530 can be disposed over a substrate (not shown in FIG. 6) and a stationary electrode (not shown). The EMS device 500a includes a plurality of first anchor points 515 providing hinge-to-substrate connections and equally spaced apart. In some implementations, the first anchor points 515 can be symmetrically arranged about the center of the movable mirror 530. In FIG. 6, the first anchor points 515 are positioned at the corners of the EMS device 500a. The EMS device 500a also includes a plurality of second anchor points 525 providing hinge-to-mirror connections and equally spaced apart. In some implementations, the second anchor points 525 can be symmetrically arranged about the center of the movable mirror 530. In FIG. 6, the second anchor points 525 are positioned at the periphery of the movable mirror 530 and, more specifically, at the edges of the movable mirror 530. The hinges 550a can be between the paired first and second anchor points. The hinges 550a may be aligned tangential to the edges of the movable mirror 530. The distance between paired first and second anchor points may be identical or at least substantially identical. The first anchor points 515 may be defined within the dashed lines 501 at the corner of the EMS device 500a, and the second anchor points 525 may be defined within the dashed lines 502 at the edges of the movable mirror 530. The top plate 550b may be defined within the dashed lines 503. In some implementations, a stiffening layer (not shown) may be added to the top plate 550b and disposed within the aforementioned set of dashed lines 503.

Figure 7:
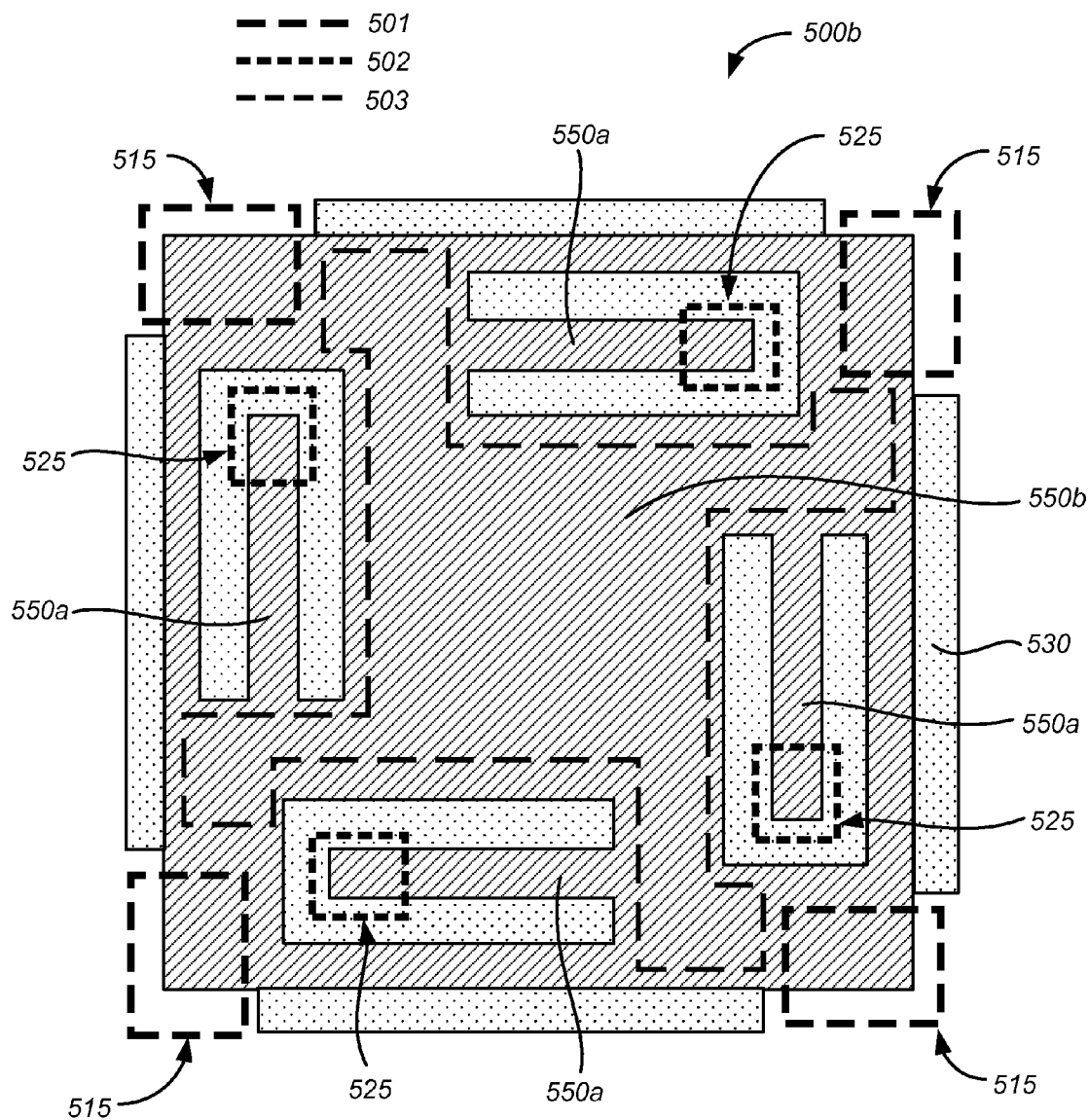
FIG. 7 shows a schematic top plan view of another example EMS device with hinge-to-mirror anchor points away from a periphery of a movable mirror.

FIG. 7 shows a schematic top plan view of another example EMS device with hinge-to-mirror anchor points away from a periphery of a movable mirror. In some implementations, a cross-section of the EMS device 500b in FIG. 7 can be the EMS device illustrated in FIG. 5E. Some differences between the EMS device 500b in FIG. 7 and the EMS device 500a in FIG. 6 can include the geometry of the top plate 550b and the positioning of the hinges 550a. The first anchor points 515 providing hinge-to-substrate connections of the EMS device 500b can be similar to the EMS device 500a. However, the second anchor points 525 providing hinge-to-mirror connections of the EMS device 500b can be further away from the periphery and closer to the center of the movable mirror 530. The first anchor points 515 and the second anchor points 525 are symmetrical about the center of the movable mirror 530 and hinge lengths are identical or at least substantially identical. It will be understood by a person of ordinary skill in the art that any suitable geometry for the top plate 550b or pixel, any suitable positioning of the hinges 550a, and any suitable number of hinges 550a can be provided. In some implementations, the geometry of the top plate 550b can include square, rectangular, hexagonal, etc. The geometry of the top plate 550b can depend on the geometry of the movable mirror 503. In some implementations, the positioning of the hinges 550a can be connected to the movable mirror 530 at the edges, at the corners, or away from the edges and towards the center of the movable mirror 530. In some implementations, the number of hinges 550a can include two, three, four, eight, or more hinges 550a.

FIGS. 8A-8E show cross-sectional schematic diagrams illustrating various stages of manufacturing an example two-terminal EMS device. The partially fabricated EMS device in FIG. 8A can include a substrate 810, a first sacrificial layer 820 over the substrate 810, and a mirror 830 over the first sacrificial layer 820. In some implementations, a stationary electrode (not shown) can be disposed on the substrate 810 so that the stationary electrode is between the substrate 810 and the first sacrificial layer 820. In some implementations, the stationary electrode can be part of the substrate 810 itself.

Figure 8A:
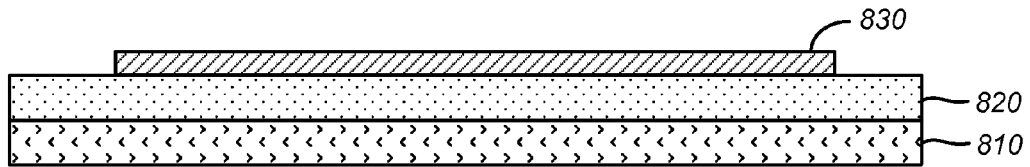
FIGS. 8A-8E show cross-sectional schematic diagrams illustrating various stages of manufacturing an example two-terminal EMS device.
Figure 8B:
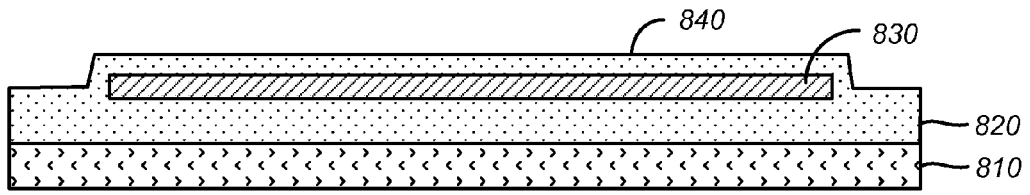

In FIG. 8B, a second sacrificial layer 840 can be formed over the mirror 830. In some implementations, the second sacrificial layer 840 can be made of the same material as the first sacrificial layer 820. In some implementations, the second sacrificial layer 840 can be made of a different material than the first sacrificial layer 820.

Figure 8C:
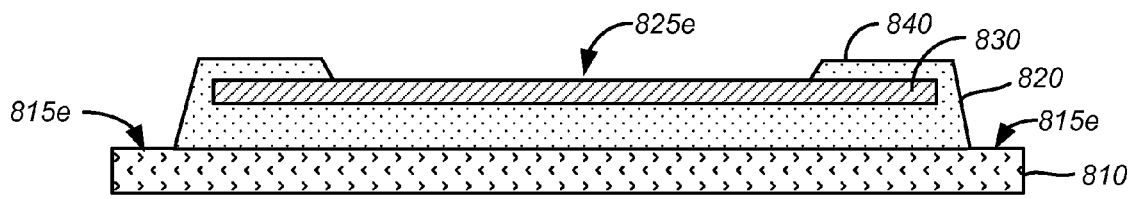

In FIG. 8C, a first mask can be applied for defining a plurality of anchor points for providing connections to the substrate 810 and connections to the mirror 830. In some implementations, the plurality of anchor points can provide hinge-to-substrate and hinge-to-mirror connections. The first mask can be applied to form a plurality of first vias 815e exposing a portion of the substrate 810 and a second via 825e exposing a portion of the mirror 830. The first vias 815e can be formed simultaneously with the second via 825e. The first vias 815e may be symmetrically arranged about the center the EMS device. The second via 825e may be formed at the back surface of the mirror 830, where the mirror 830 can include a front surface facing the substrate 810 and a back surface opposite the front surface. The first vias 815e and the second via 825e are formed and patterned using a single mask.

Figure 8D:
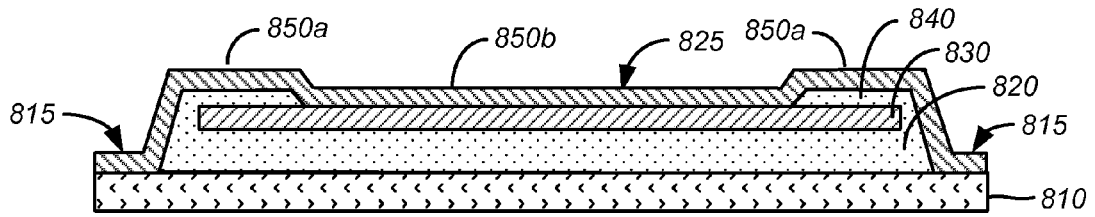

In FIG. 8D, a plurality of hinges 850a may be formed where the hinges 850a are connected to the substrate 810 at first anchor points 815 and connected to the mirror 830 at second anchor points 825. The first anchor points 815 can represent connections of the EMS device to the substrate, such as hinge-to-substrate connections, and can correspond to the first vias 815e in FIG. 8C. The plurality of first anchor points 815 can be equally spaced apart. The second anchor points 825 can represent connections of the EMS device to the mirror 830, such as hinge-to-mirror connections, and can correspond to the second vias 825e in FIG. 8C. The plurality of second anchor points 825 can be equally spaced apart. Each of the first anchor points 815 can correspond to at least one of the second anchor points 825 to define a plurality of paired first and second anchor points. For example, the first anchor point 815 and the second anchor point 825 on the left side may be paired with each other while the first anchor point 815 and the second anchor point 825 on the right side may be paired with each other.

The hinges 850a may have identical or at least substantially identical hinge lengths. This can make the mirror 830 more tilt resistant, which can reduce the effects of tilt instability. The hinges 850a may be formed between the paired first and second anchor points, where the hinge length may be defined between the paired first and second anchor points. In some implementations, the hinges 850a may be symmetrically arranged about the center of the EMS device. For example, the hinges 850a may be positioned to connect to the mirror 830 at the edges of the mirror 830 or at the corners of the mirror 830, which can further reduce the effects of tilt instability. The hinges 850a may support the mirror 830 and, in some implementations, are suspended over the mirror 830. As shown in FIG. 8D, the hinges 850a are connected to the mirror 830 at the back surface of the mirror 830. In some implementations, the hinges 850a may include one or more metals, such as aluminum (Al) and titanium (Ti), or other materials such as silicon (Si), oxides, nitrides, and oxynitrides. In some implementations, the hinges 850a may include a tri-layer stack, such as a first metal layer, a second metal layer over the first metal layer, and a dielectric layer between the first metal layer and the second metal layer.

In some implementations, a top plate 850b may be formed over the second sacrificial layer 840 simultaneous with forming the plurality of hinges 850a. Forming the top plate 850b and the hinges 850a can include depositing a layer of material over the second sacrificial layer 840 as well as in the first vias 815e and the second via 825e. A second mask can be applied to pattern the layer of material so that hinges 850a are formed to support the mirror 830, and the top plate 850b is formed over the mirror 830. Thus, the top plate 850b may share substantially the same composition and thickness as the plurality of hinges 850a because they can be formed from the same layer or layers of material. In FIG. 8D of the partially fabricated EMS device, the top plate 850b is formed directly on the back surface of the mirror 830. Thus, the top plate 850b can be merged with the mirror 830.

Figure 8E:
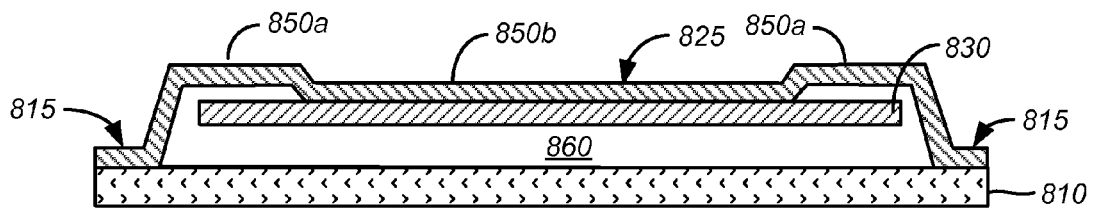

In FIG. 8E, the first sacrificial layer 820 may be removed to form a gap 860 between the mirror 830 and the substrate 810. The second sacrificial layer 840 may be removed simultaneously with the first sacrificial layer 820. The removal of the second sacrificial layer 840 may form another gap between the mirror 830 and each of the hinges 850a suspended over the mirror 830. However, no gap is formed between the mirror 830 and the top plate 850b. The first sacrificial layer 820 and the second sacrificial layer 840 may be removed using any suitable etchant. Upon removal of the sacrificial layers, the partially fabricated EMS device can be released. The mirror 830 may move across the gap 860 by electrostatic actuation between the movable mirror 830 and the stationary electrode. In some implementations, the top plate 850b over the movable mirror 830 may serve as an electrode, or the movable mirror 830 may include an electrode. The electrode can apply a voltage, which creates an electrostatic force on the mirror 830 to move the mirror 830 across the gap 860 towards the substrate 810. In some implementations, the top plate 850*b* moves with the mirror 830 so that the movements are coupled. Thus, the implementation of the EMS device in FIG. 8E can represent a two-terminal EMS device, with the stationary electrode and the movable mirror 830 serving as the terminals.

In some implementations, the EMS device can further include a stiffening layer (not shown) disposed on the top plate 850*b*, where a thickness of the stiffening layer is greater than a thickness of the top plate 850*b*. In some implementations, additional circuitry and/or TFTs may be formed on the stiffening layer, where the additional circuitry and TFTs may control the movements of the mirror 830. In some other implementations, the additional circuitry and/or TFTs may be formed on the top plate 850*b* without the stiffening layer.

Figure 9A:
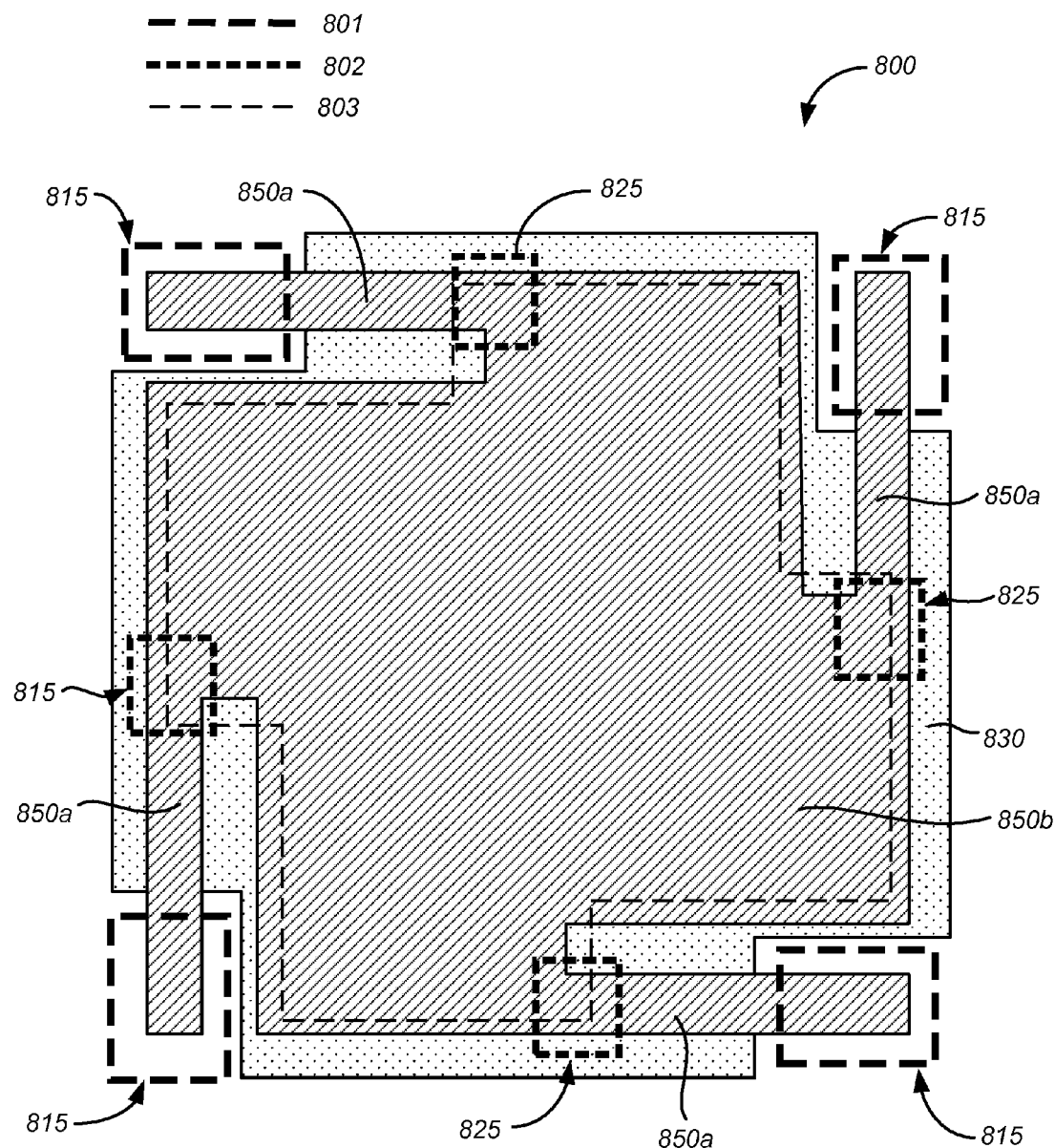
FIG. 9A shows a schematic top plan view of an example two-terminal EMS device.
Figure 9B:
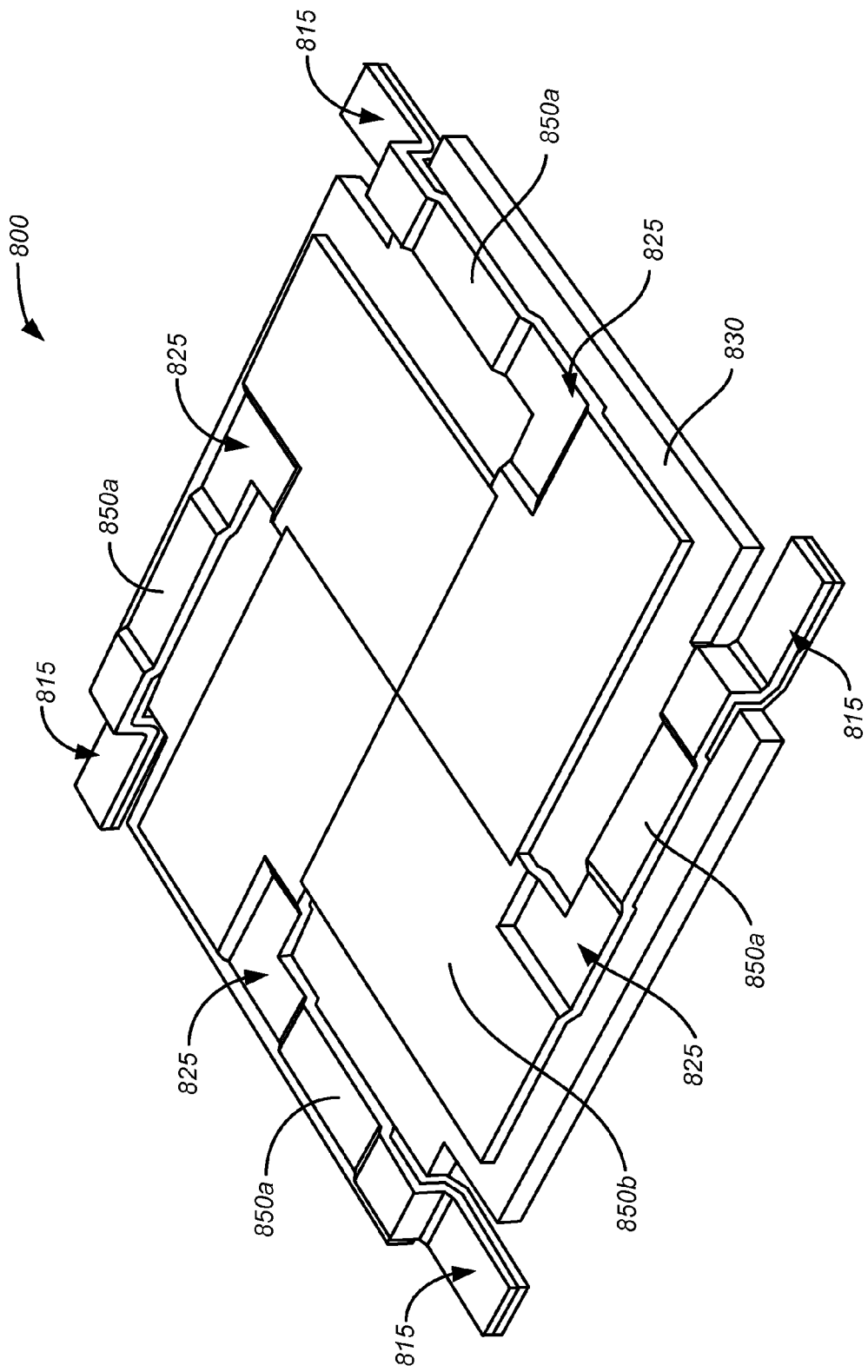
FIG. 9B shows a schematic perspective view of the two-terminal EMS device of FIG. 9A.

FIG. 9A shows a schematic top plan view of an example two-terminal EMS device. FIG. 9B shows a schematic perspective view of the two-terminal EMS device of FIG. 9A. In some implementations, a cross-section of the EMS device 800 in FIGS. 9A and 9B can be the EMS device illustrated in FIG. 8E. The EMS device 800 can include a top plate 850*b* on the movable mirror 830, where the movable mirror 830 can be disposed over a substrate (not shown in FIGS. 9A and 9B) and a stationary electrode (not shown). The EMS device 800 includes a plurality of first anchor points 815 providing hinge-to-substrate connections and equally spaced apart. In some implementations, the first anchor points 815 can be symmetrically arranged about the center of the movable mirror 830. In FIGS. 9A and 9B, the first anchor points 815 are positioned at the corners of the EMS device 800. The EMS device 800 also includes a plurality of second anchor points 825 providing hinge-to-mirror connections and equally spaced apart. In some implementations, the second anchor points 825 can be symmetrically arranged about the center of the movable mirror 830. In FIGS. 9A and 9B, the second anchor points 825 are positioned at the periphery of the movable mirror 830 and, more specifically, at the edges of the movable mirror 830. The hinges 850*a* can be between the paired first and second anchor points. The hinges 850*a* may be aligned tangential to the edges of the movable mirror 830. The distance between the paired first and second anchor points may be identical or at least substantially identical. In FIG. 8A, the first anchor points 815 may be defined within the dashed lines 801 at the corners of the EMS device 800, and the second anchor points 825 may be defined within the dashed lines 802 at the edges of the movable mirror 830. The top plate 850*b* may be defined within dashed lines 803. In some implementations, a stiffening layer may be added to the top plate 850*b* and disposed within the aforementioned set of dashed lines 803. In FIG. 8B, the stiffening layer can increase the thickness to the top plate 850*b*.

Figure 10A:
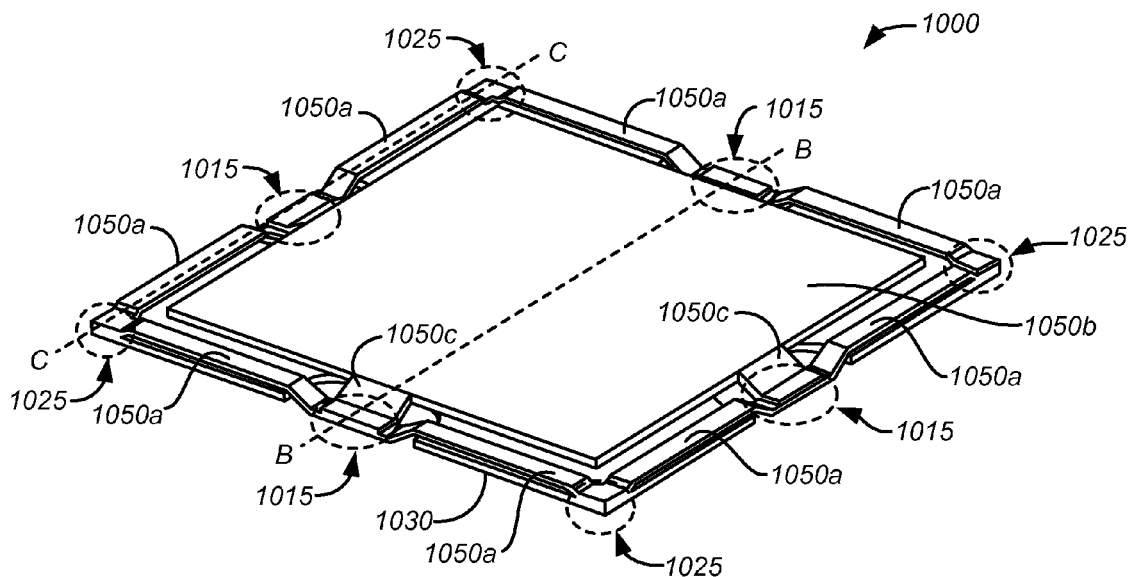
FIG. 10A shows a schematic perspective view of an example three-terminal EMS device.
Figure 10B:
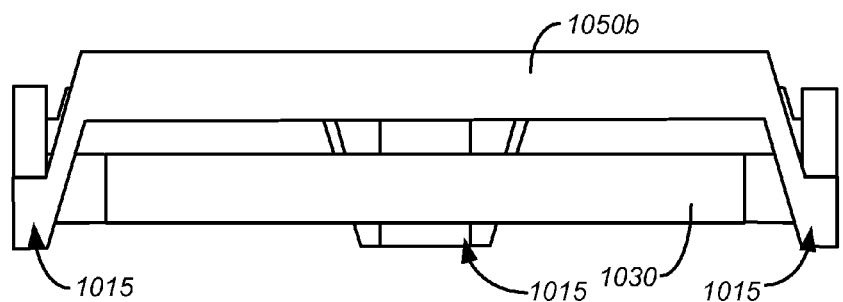
FIG. 10B shows a cross-sectional schematic view of the three-terminal EMS device of FIG. 10A along line B-B.
Figure 10C:
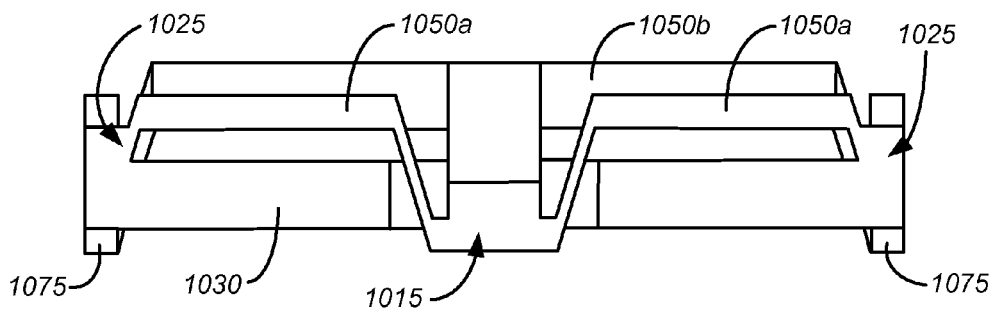
FIG. 10C shows a cross-sectional schematic view of the three-terminal EMS device of FIG. 10A along line C-C.

FIG. 10A shows a schematic perspective view of an example three-terminal EMS device. FIG. 10B shows a cross-sectional schematic view of the three-terminal EMS device of FIG. 10A along line B-B. FIG. 10C shows a cross-sectional schematic view of the three-terminal EMS device of FIG. 10A along line C-C. The EMS device 1000 can include a substrate (not shown), a stationary electrode (not shown) over the substrate, and a movable mirror 1030 over the stationary electrode. The EMS device 1000 can also include a top plate 1050*b* over the movable mirror 1030. The EMS device 1000 can further include a plurality of hinges 1050*a* connected to the movable mirror 1030 to support the movable mirror 1030. The hinges 1050*a* can be suspended over the movable mirror 1030 and connected to the movable mirror 1030 at the outermost areas of the movable mirror 1030, namely at the corners of the movable mirror 1030. The hinges 1050*a* may be connected to the substrate at a plurality of first anchor points 1015, and connected to the mirror 1030 at a plurality of second anchor points 1025. Having the hinges 1050*a* connected at the outermost areas (e.g., corners) of the movable mirror 1030 can provide increased rotational stiffness and reduce the effects of tilt instability. This can make the movable mirror 1030 more tilt resistant.

The first anchor points 1015 providing hinge-to-substrate connections and the second anchor points 1025 providing hinge-to-mirror connections can be formed by a single mask. In FIGS. 10A-10C, the first anchor points 1015 are positioned around a periphery of the EMS device 1000 and equally spaced from each other. The second anchor points 1025 are positioned at the corners of the movable mirror 1030 and equally spaced from each other. Adjacent first and second anchor points can form paired first and second anchor points. The distance between the paired first and second anchor points can be identical. Each of the hinges 1050*a* can be between the paired first and second anchor points, where the hinges 1050*a* can be identical or at least substantially identical in length.

As shown in FIG. 10A, the movable mirror 1030 can be supported by eight hinges 1050*a*. The hinges 1050*a* may be positioned around a periphery of the top plate 1050*b*. The hinges 1050*a* may be aligned tangential to the edges of the movable mirror 1030. The hinges 1050*a* may be suspended over the movable mirror 130 to an extent that provides for a large fill factor. With more of the hinges 1050*a* suspended over the movable mirror 1030 and "hidden," the EMS device 1000 can have a larger fill factor, which can provide more viewable area in an EMS display device. By way of an example, the EMS device 1000 can have a fill factor of greater than about 55%, or greater than about 60%, or even greater than about 70% for small displays. It will be understood that the fill factor values can vary depending on the dimensions of the EMS device.

The EMS device 1000 can further include a plurality of smaller hinges 1050*c* connected to the top plate 1050*b* and supporting the top plate 1050*b*. The smaller hinges 1050*c* may extend from the first anchor points 1015 and connect at the edges of the top plate 1050*b*. In some implementations, the smaller hinges 1050*c* can be made of the same layer or layers of material as the top plate 1050*b*. In some implementations, the smaller hinges 1050*c* providing support to the top plate 1050*b* can be shorter, wider, and thicker than the hinges 1050*a* providing support to the movable mirror 1030. That way, the smaller hinges 1050*c* can provide stiffer support for the top plate 1050*b*. With the incorporation of the smaller hinges 1050*c* to support the top plate 1050*b*, movement by the movable mirror 1030 will generally not affect the top plate 1050*b*.

The EMS device 1000 can be a three-terminal EMS device, where the stationary electrode can function as a first electrode or bottom electrode, the movable mirror 1030 can function as a second electrode or movable electrode, and the top plate 1050*b* can function as a third electrode or top electrode. A voltage can be applied to the EMS device 1000 to cause the movable mirror 1030 to actuate towards the stationary electrode or towards the top plate 1050*b*.

Various circuitry and TFTs can be disposed on the top plate 1050*b*. With respect to the implementation in FIGS. 10A-10C, circuit lines can easily route through the first anchor points 1015 and the second anchor points 1025. For example, in EMS or MEMS display devices, transmission of data lines, ground lines, and reset lines can easily run from the top plate 1050*b* through the first anchor points 1015 and the second anchor points 1025 from pixel to pixel. Via connections to the movable mirror 1030 can be made at the second anchor points 1025, and via connections to the substrate or stationary electrode can be made at the first anchor points 1015.

The EMS device 1000 can further include a plurality of movable posts 1075, as shown in FIG. 10C. Each of the movable posts 1075 may protrude or include protrusions from a front surface of the movable mirror 1030, where the front surface faces the substrate and a back surface is opposite the front surface. Each of the movable posts 1075 may be positioned at the corners of the movable mirror 1030. When the movable mirror 1030 moves towards the stationary electrode of the EMS device 1000, the movable post 1075 has protrusions to make contact with a surface of the EMS device 1000 facing the movable mirror 1030 before the movable mirror 1030 makes contact. The protrusion of the movable post 1075 can be configured to change the stiffness of the EMS device 1000 upon contact. When any protrusion of the movable posts 1075 makes contact with the surface of the EMS device 1000, the surface of the EMS device or the movable mirror 1030 may be non-rigid so that the movable mirror 1030 may continue moving towards the stationary electrode during actuation from an applied voltage.

Figure 11A:
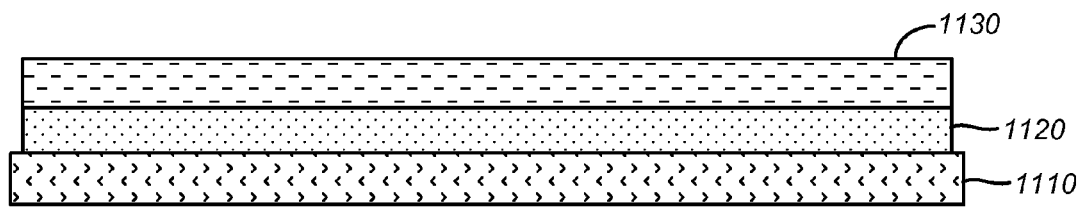
FIGS. 11A-11D show cross-sectional schematic diagrams illustrating various stages of manufacturing an example EMS device with coplanar hinges and movable mirror.

FIGS. 11A-11D show cross-sectional schematic diagrams illustrating various stages of manufacturing an example EMS device with coplanar hinges and movable mirror. In FIG. 11A, a partially fabricated EMS device includes a substrate 1110. A sacrificial layer 1120 is formed over the substrate 1110, and a mirror layer 1130 is formed over the sacrificial layer 1120. In some implementations, additional layers or components can be formed between the substrate 1110 and the sacrificial layer 1120, such as a stationary electrode.

Figure 11B:
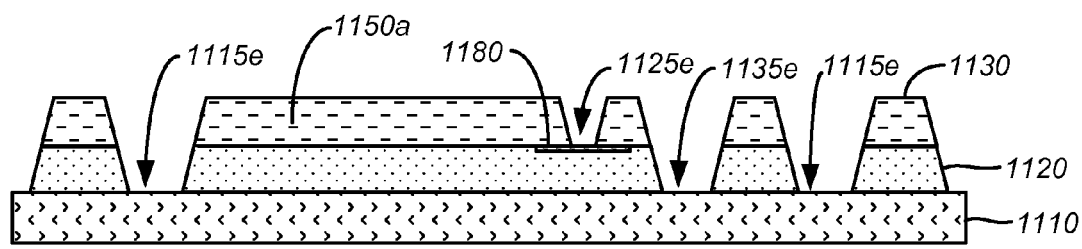

In some implementations, an etch stop layer 1180 can be formed between the sacrificial layer 1120 and the mirror layer 1130. In FIG. 11B, a plurality of first vias 1115e and third vias 1135e can be formed to expose a portion of the substrate 1110, and a plurality of second vias 1125e can be formed to expose a portion of the etch stop layer 1180. The first vias 1115e and third vias 1135e can be formed by etching through the mirror layer 1130 and the sacrificial layer 1120. The second vias 1125e can be formed by etching through the mirror layer 1130. The etch stop layer 1180 can be provided to prevent etching through the sacrificial layer 1120 so that the second vias 1125e do not extend through the sacrificial layer 1120. Each of the first vias 1115e can be paired with at least one second via 1125e, where the distance between the paired first and second vias can be identical. The first vias 1115e and the second vias 1125e can be formed using a single mask.

The formation of the first vias 1115e, the second vias 1125e, and the third vias 1135e can pattern the mirror layer 1130 to form a plurality of hinges 1150a and a mirror (not shown in FIGS. 11A-11D) out of the mirror layer 1130. Such a mirror can be seen in mirror 1150b for an EMS device 1100 in FIG. 12. The hinges 1150a may be made out of the same layer or layers of material as the mirror 1150b. Further, the hinges 1150a and the mirror 1150b can have the same thickness. Thus, at least part of each of the plurality of hinges 1150a and the mirror 1150b are coplanar. In some implementations, all of the plurality of hinges 1150a and the mirror 1150b are coplanar.

Figure 11C:
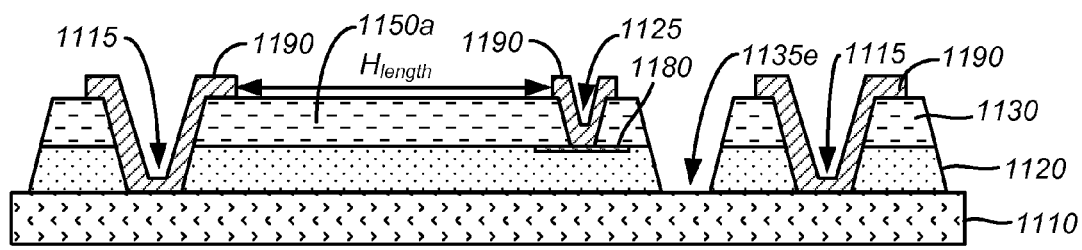

In FIG. 11C, a reinforcing layer 1190 can be formed in each of the first vias 1115e to form a plurality of first anchor points 1115, and in each of the second vias 1125e to form a plurality of second anchor points 1125. The reinforcing layer 1190 is not formed in the vias 1135e, however. The first anchor points 1115 and the second anchor points 1125 can be defined by the reinforcing layer 1190. The reinforcing layer 1190 may be patterned so that it does not cover the entirety of the mirror layer 1130. However, in some implementations, the reinforcing layer 1190 may partially extend over the mirror layer 1130. The reinforcing layer 1190 may be patterned so as to not etch through the mirror layer 1130. In some implementations, the reinforcing layer 1190 also may be referred to as anchor plugs.

Each of the first anchor points 1115 can be paired with at least one second anchor point 1125. Each of the hinges 1150 may be between the paired first and second anchor points. The hinges 1150a may have identical or at least substantially identical hinge lengths, where hinge length can be defined between the paired first and second anchor points. Identical hinge lengths increase the tilt resistance of the mirror 1150b, which can reduce the effects of tilt instability. The reinforcing layer 1190 may connect the hinges 1150a to the substrate 1110 at the first anchor points 1115. The reinforcing layer 1190 may also connect the hinges 1150a to the mirror 1150b at the second anchor points 1125. The second anchor points 1125 providing connection of the hinges 1150a to the mirror 1150b can further reduce the effects of tilt instability by connecting to the mirror 1150b near the edges of the mirror 1150. Generally, the further the connection of the hinge 1150a to the mirror 1150b, the greater the increase in tilt resistance. The hinges 1150a may support the mirror 1150b via the reinforcing layer 1190 at the second anchor points 1125, and the reinforcing layer 1190 may support the hinges 1150a at the first anchor points 1115.

Figure 11D:
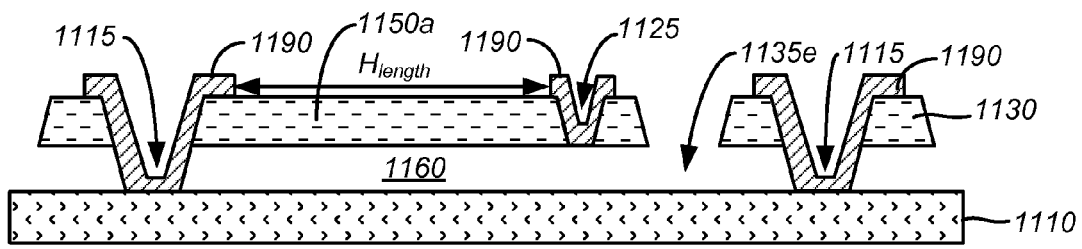

In FIG. 11D, the sacrificial layer 1120 may be removed to form a gap 1160 between the mirror layer 1130 and the substrate 1110. The sacrificial layer 1120 may be removed using any suitable etchant to release the EMS device. The mirror 1150b from the mirror layer 1130 is capable of moving across the gap 1160, and the hinges 1150a from the mirror layer 1130 are capable of deflection.

The implementation of the EMS device in FIG. 11D may or may not include a top plate. Any incorporation of a top plate or a cover plate can be separately added to the EMS device. Thus, the implementation of the EMS device in FIG. 11D may represent a two-terminal EMS device. Furthermore, the process flow for manufacturing the two-terminal EMS device in FIG. 11D may exclude a second sacrificial layer, such as a second sacrificial layer on the mirror layer 1130, which can simplify the processing of the two-terminal EMS device in FIG. 11D.

Figure 12:
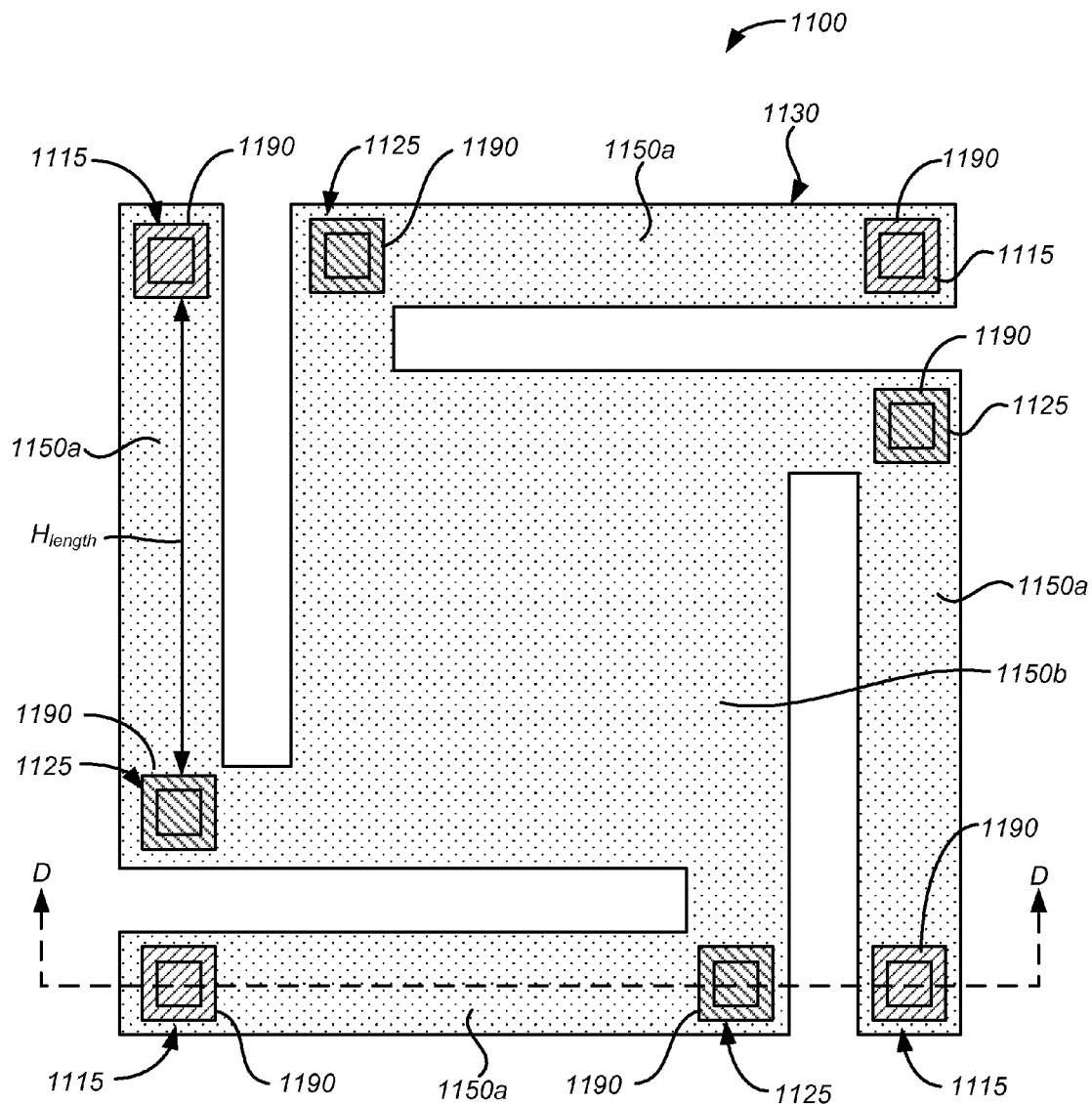
FIG. 12 shows a schematic top plan view of an example EMS device with coplanar hinges and movable mirror.

FIG. 12 shows a schematic top plan view of an example EMS device with coplanar hinges and movable mirror. In some implementations, a cross-section along lines D-D of the EMS device 1100 in FIG. 12 can be the EMS device illustrated in FIG. 11D. The EMS device 1100 can include a movable mirror 1150b and a plurality of hinges 1150a connected to the movable mirror 1150b. The hinges 1150a can be connected to the substrate via the reinforcing layer 1190 at the first anchor points 1115, and the movable mirror 1150b can be connected to the hinges 1150a via the reinforcing layer 1190 at the second anchor points 1125. The movable mirror 1150b can be disposed over a substrate (not shown in FIG. 12) and a stationary electrode (not shown). The EMS device 1100 includes a plurality of first anchor points 1115 providing hinge-to-substrate connections and equally spaced apart. In some implementations, the first anchor points 1115 can be symmetrically arranged about the center of the movable mirror 1150b. The EMS device 1100 also includes a plurality of second anchor points 1125 providing hinge-to-mirror connections and equally spaced apart. In some implementations, the second anchor points 1125 can be symmetrically arranged about the center of the movable mirror 1150b. In FIG. 12, the second anchor points 1125 are positioned proximate the corners of the movable mirror 1150b. Hinge-to-mirror connections that are proximate the corners of the movable mirror 1150b can further increase the tilt resistance of the movable mirror 1150b. The hinges 1150a can be between the paired first and second anchor points. The hinges 1150a may be aligned tangential to the edges of the movable mirror 1150b. The distance between the paired first and second anchor points may be identical or at least substantially identical.

Figure 13:
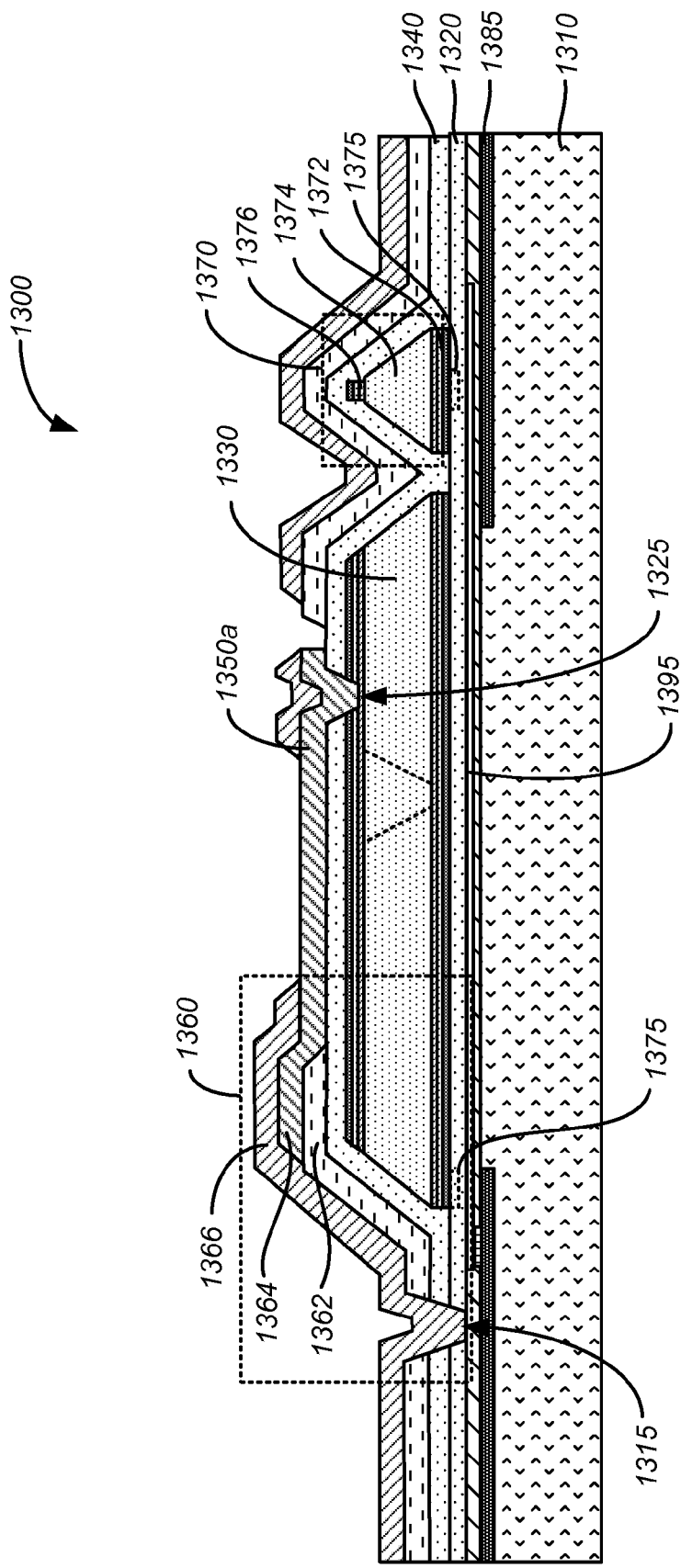
FIG. 13 shows a cross-sectional schematic diagram of an example EMS device including a support frame and one or more movable posts.

FIG. 13 shows a cross-sectional schematic diagram of an example EMS device including a support frame and a movable post. Not only can the use of a single mask to create identical or at least substantially identical hinge lengths contribute to increasing the mechanical restoring torque of an EMS device, but incorporation of a support frame and/or a movable post can increase the mechanical restoring torque of the EMS device. Incorporation of such structures can reduce tilt instability and make the movable mirror of the EMS device more tilt resistant.

In FIG. 13, the EMS device 1300 can include a support frame 1360 and a movable post 1370. The EMS device 1300 can include a substrate 1310 and a stationary electrode 1395 on the substrate 1310. In some implementations, the stationary electrode 1395 can serve as one of the terminals of the EMS device 1300. In some implementations, the stationary electrode 1395 can be incorporated with the substrate 1310. The EMS device 1300 can also include a black mask 1385 on the substrate 1310, where the black mask 1385 can be electrically connected to the stationary electrode 1395.

Prior to release, the EMS device 1300 can include a first sacrificial layer 1320 over the stationary electrode 1395. The EMS device 1300 can further include a mirror 1330 over the first sacrificial layer 1320 and a second sacrificial layer 1340 over the mirror 1330. The mirror 1330 can serve as another one of the terminals of the EMS device 1300. The EMS device 1300 can further include one or more hinges 1350a over the second sacrificial layer 1340 and connected to the mirror 1330 to support the mirror 1330. Upon release, the first sacrificial layer 1320 can be removed to form a first gap between the stationary electrode 1395 and the mirror 1330. The second sacrificial layer 1340 can be removed to form a second gap between the one or more hinges 1350a and the mirror 1330, where the one or more hinges 1350a can be suspended over the mirror 1330. In some implementations, a top plate (not shown) can be formed out of the same layer or layers of material as the one or more hinges 1350a so that the second gap is between the mirror 1330 and the top plate. The top plate can serve as another one of the terminals of the EMS device 1300.

In some implementations, the mirror 1330 can include multiple layers. For example, the mirror 1330 can include multiple layers in a symmetric arrangement so as to balance stresses that may otherwise be caused by a mismatch of coefficients of thermal expansion (CTEs) with various materials. The symmetrical construction can provide increased structural rigidity and control the shape of the mirror 1330 during actuation. In FIG. 13, the mirror 1330 can include a first mirror stack 1372, a second mirror stack 1376 over the first mirror stack 1372, and a dielectric layer 1374 between the first mirror stack 1372 and the second mirror stack 1376. Each of the first mirror stack 1372 and the second mirror stack 1376 can have materials and thicknesses that are identical. By way of example, each mirror stack 1372 and 1376 can include a layer with a high index of refraction, a layer with a low index of refraction, and a layer that is electrically conductive. The dielectric layer 1374 can be made of any suitable dielectric material and can have a relatively large thickness, such as a thickness greater than about 2500 Å.

The thicknesses of the multiple layers of the mirror 1330 can lead to topography issues. This means that to connect to a back surface of the mirror 1330, any structure supporting the mirror 1330 from the substrate 1310 to the back surface of the mirror 1330 would cross a step height of the mirror 1330. Typically, the one or more hinges 1350a would cross the step height of the mirror 1330, where the one or more hinges 1350a would be conformally deposited on the second sacrificial layer 1340 and follow the topography of the second sacrificial layer 1340. After release, the one or more hinges 1350a are suspended over the mirror 1330, but the one or more hinges 1350a may not be structurally rigid from the hinge-to-mirror connection to the hinge-to-substrate connection. This can be due in part to the topography produced by the mirror 1330, where the one or more hinges 1350a would cross the step height of the mirror 1330 so as to slope upwards and over the back surface of the mirror 1330.

A support frame 1360 can be incorporated in the EMS device 1300 to overcome topography issues that may result from construction of the mirror 1330. The support frame 1360 can be connected to the substrate 1310 at one or more first anchor points 1315, where the first anchor points 1315 provide connection to the substrate 1310. The one or more hinges 1350a can be connected to the support frame 1360 and suspended over the mirror 1330, where the one or more hinges 1350a can be connected to the back surface of the mirror 1330 at one or more second anchor points 1325, where the second anchor points 1325 provide connection to the mirror 1330. In some implementations, the support frame 1360 can include a plurality of layers, such as a stack of a first dielectric layer 1362, a metal layer 1364, and a second dielectric layer 1366. The metal layer 1364 can be the same layer of material as the one or more hinges 1350a. The second dielectric layer 1366 can serve as an anchor to the substrate 1310 at the first anchor points 1315. The support frame 1360 also may be referred to as a stiff frame or a stiff post.

Figure 14A:
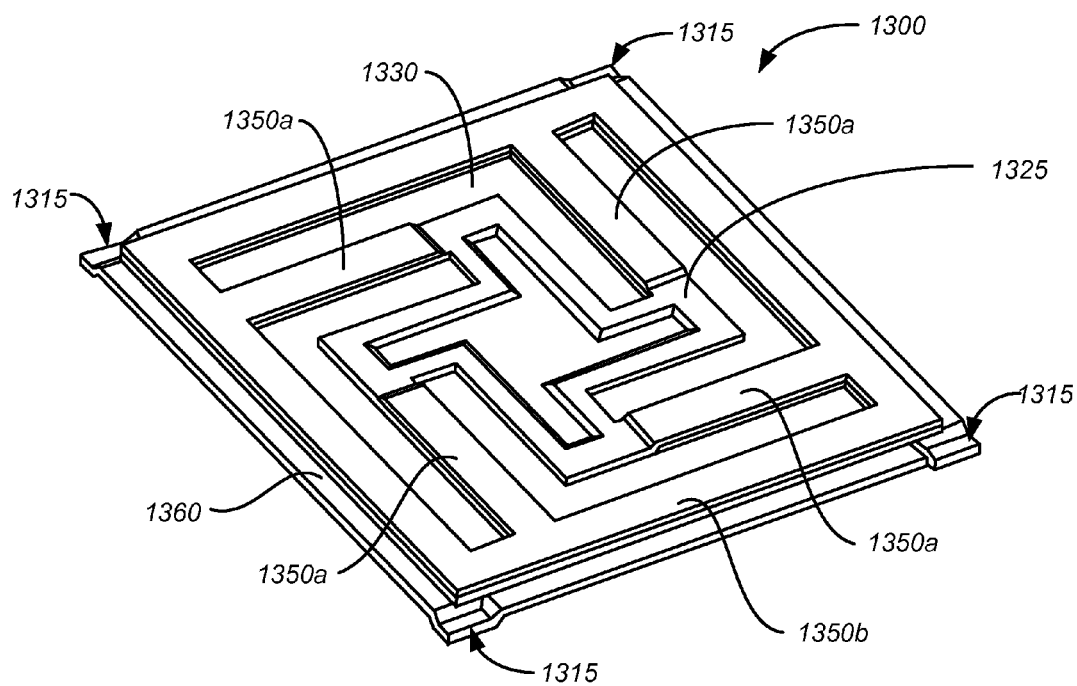
FIG. 14A shows a schematic top plan view of an example EMS device including a support frame.
Figure 14B:
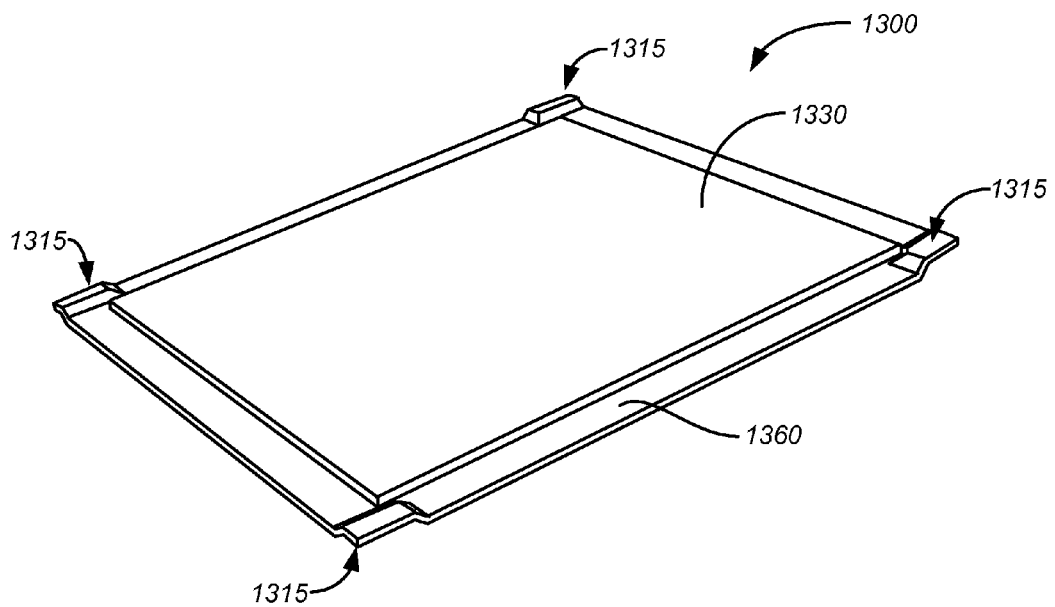
FIG. 14B shows a schematic bottom view of the EMS device of FIG. 14A.

An illustration of the support frame 1360 can be seen in FIGS. 14A and 14B. FIG. 14A shows a schematic top plan view of an example EMS device including a support frame. FIG. 14B shows a schematic bottom view of the EMS device of FIG. 14A. As illustrated in FIGS. 14A and 14B, the support frame 1360 can be connected to the substrate 1310 at the first anchor points 1315, where the support frame 1360 is all around the periphery of the mirror 1330. The support frame 1360 can be all around the mirror 1330 and, in some implementations, can be partially overlapping or at least over the back surface of the mirror 1330. The support frame 1360 can provide structural rigidity to the EMS device 1300 by supporting the hinges 1350a and the top plate 1350b. The plurality of hinges 1350a are connected to the mirror 1330 at the second anchor points 1325 and also connected to the support frame 1360.

The support frame 1360 can increase structural rigidity by serving as a support structure around the substrate 1310. In fact, the support frame 1360 can be continuous all around the substrate 1310. The support frame 1360 can provide an anchor to the substrate 1310 and protrude from the substrate 1310. When various structures of the EMS device 1300, such as the hinges 1350a and the top plate 1350b are deposited, such structures would not have to cross the step height of the mirror 1330. Rather, the hinges 1350a and the top plate 1350b can connect to what is already protruding from the substrate 1310, namely the support frame 1360. This enables the hinges 1350a and the top plate 1350b to connect to the substrate 1310 via the support frame 1360 without having to cross the step height of the mirror 1330. This also can increase the stiffness of the hinges 1350 by effectively reducing the hinge length of the hinges 1350.

Returning to FIG. 13, the EMS device 1300 can further include one or more movable posts 1370. The one or more movable posts 1370 can be configured to contact the stationary electrode 1395 during actuation before the mirror 1330 contacts the stationary electrode 1395. The one or more movable posts 1370 can include one or more protrusions 1375 that protrude from a surface of the one or more movable posts 1370 facing the substrate 1310. The one or more movable posts 1370 can be non-rigid (e.g., flexible) so that when any protrusion 1375 contacts the stationary electrode 1395, or any surface facing the one or more protrusions 1375 during actuation, the one or more movable posts 1370 and the mirror 1330 would continue moving towards the stationary electrode 1395 during actuation. In other words, the one or more protrusions 1375 of the one or more movable posts 1370 do not function as a stopper to prevent further motion across the gap, but can function as a spring to permit further motion across the gap during actuation.

In some implementations, the one or more movable posts 1370 can be connected to or be a part of the one or more hinges 1350a. In some implementations, the one or more movable posts 1370 may be connected or be a part of the mirror 1330. As shown in FIG. 13, the one or more movable posts 1370 can include the same layers of material as the mirror 1330. Accordingly, the one or more movable posts 1370 can include a first mirror stack 1372, a dielectric layer 1374, and a second mirror stack 1376. This portion of the one or more movable posts 1370 can be referred to as the movable post spring, and the one or more protrusions 1375 can protrude from the movable post spring.

The one or more movable posts 1370 can have a tapered profile. For example, a taper angle of 15 degrees or more, 30 degrees or more, or 45 degrees or more for an etch process can be applied to the movable post spring to produce the tapered profile. The cross-section of the movable post spring can be gradually changing. When the one or more protrusions 1375 make contact with a surface opposite the one or more protrusions 1375 during actuation, the movable post spring applies a gradually changing force during contact. This can increase the stable range of the EMS device 1300.

Figure 15:
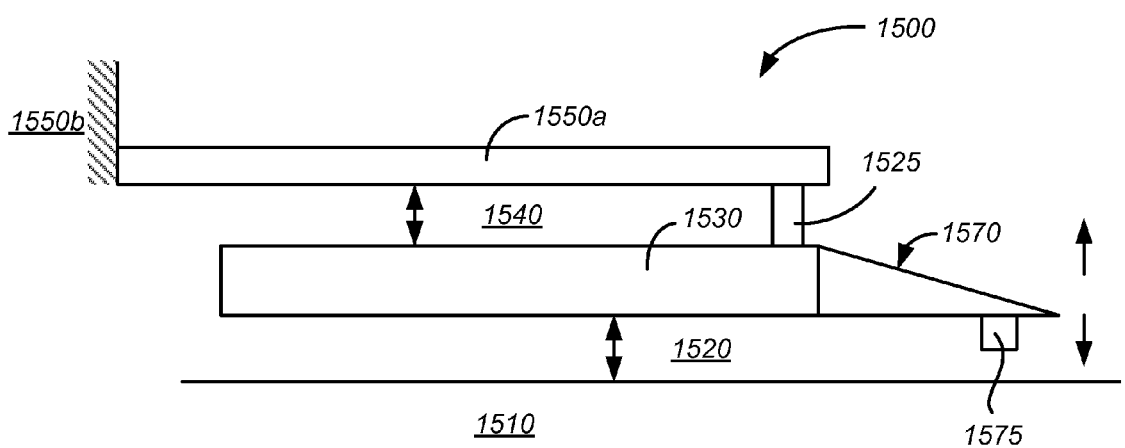
FIG. 15 shows a schematic diagram of an example movable post having a tapered profile and connected to a movable mirror of an EMS device.

FIG. 15 shows a schematic diagram of an example movable post having a tapered profile and connected to a movable mirror of an EMS device. The EMS device 1500 can include a hinge 1550a connected to a back surface of a movable mirror 1530 at a second anchor point 1525. In some implementations, the hinge 1550a may be connected to a substrate 1510 at a first anchor point (not shown) or connected to the substrate 1510 via a support frame (not shown). The movable mirror 1530 can be configured to actuate across a first gap 1520 between the substrate 1510 and the movable mirror 1530. In some implementations, where the EMS device 1500 is a three-terminal EMS device, the movable mirror 1530 can be configured to actuate across a second gap 1540 between the movable mirror 1530 and the hinge 1550a and between the movable mirror 1530 and the top plate 1550b. In some implementations, the hinge 1550a can be decoupled from the movable mirror 1530, which can allow for more design freedom. For example, this can mean that the hinge 1550a can be made of a different material than the movable mirror 1530, providing more choice of material for the hinge 1550a so that the hinge 1550a can be more mechanically robust than the movable mirror 1530. This can provide greater image retention in the EMS device 1500. A movable post 1570 can be connected to or be a part of the movable mirror 1530. The movable post 1570 can include a protrusion 1575 configured to contact the substrate 1510 before the movable mirror 1530 contacts the substrate 1510 during actuation across the first gap 1520. As shown in FIG. 15, the movable post 1570 can include a wedged movable post spring connected to the mirror 1530, such as at the periphery of the mirror 1530. The tapered profile of the wedged movable post spring provides a gradient spring constant. When the protrusion 1575 contacts the substrate 1510, the wedged movable post spring provides "gentle" contact behavior so that the force exerted from the movable post 1570 is gradually changing during actuation. For display devices, this can reduce the overdrive voltage from one color to another color, such as from back to white, thereby providing for an increased stable range.

Figure 16:
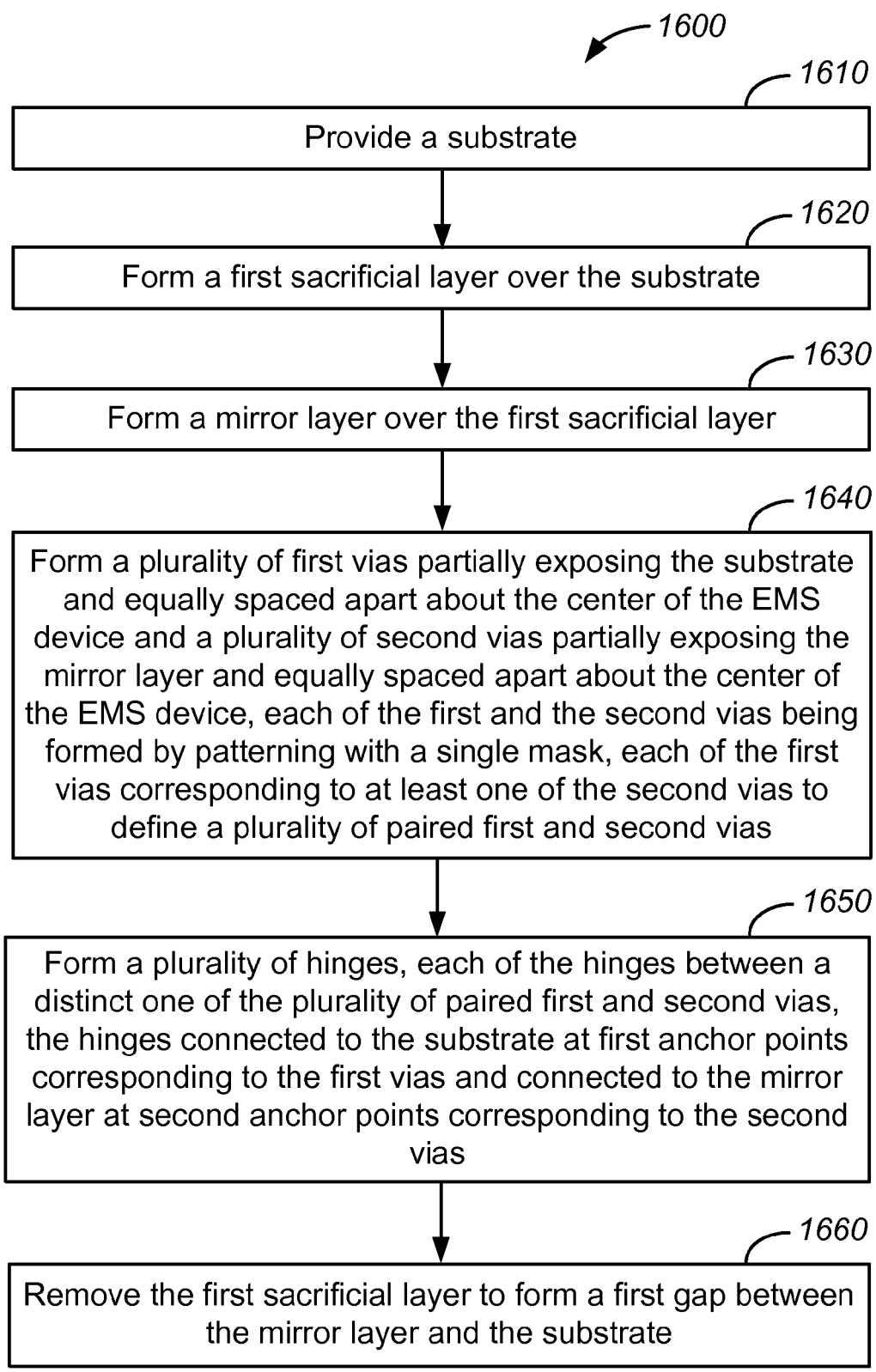
FIG. 16 shows a flow diagram illustrating an example process for manufacturing an EMS device.

FIG. 16 shows a flow diagram illustrating an example process for manufacturing an EMS device. The process 1600 may be performed in a different order or with different, fewer, or additional operations.

At block 1610, a substrate is provided. In some implementations, the substrate can include a transparent material, such as glass or plastic. In some implementations, the substrate can include a semiconducting material, such as silicon.

At block 1620, a first sacrificial layer is formed over the substrate. The first sacrificial layer can include but is not limited to an etchable material, such as molybdenum or amorphous silicon. The thickness of the first sacrificial layer can correspond to the desired size of a first gap to be formed in the EMS device.

At block 1630, a mirror layer is formed over the first sacrificial layer. The mirror layer can include one or more layers, including a reflective layer made of a reflective material, such as aluminum or aluminum alloy. In some implementations, the mirror layer can include an electrode.

At block 1640, a plurality of first vias are formed partially exposing the substrate and equally spaced apart about the center of the EMS device, and a plurality of second vias are formed partially exposing the mirror layer and equally spaced apart about the center of the EMS device. Each of the first vias and the second vias are formed by patterning with a single mask, where each of the first vias correspond to at least one of the second vias to define a plurality of paired first and second vias. Rather than using multiple masks to expose a portion of the substrate and a portion of the mirror layer, a single mask can be used to ensure equally spaced apart vias formed simultaneously. In some implementations, the first vias and the second vias can correspond to anchor points for hinge-to-substrate connections and hinge-to-mirror connections, respectively. In some implementations, the second anchor points can connect the hinges to the mirror layer at the corners of the mirror layer.

In some implementations, a second sacrificial layer is formed over the mirror layer, where the first vias are formed by patterning through the first sacrificial layer and the second vias are formed by patterning through the second sacrificial layer. The second sacrificial layer can include but is not limited to an etchable material, such as molybdenum or amorphous silicon. The thickness of the second sacrificial layer can correspond to the desired size of a second gap to be formed in the EMS device.

At block 1650, a plurality of hinges are formed, each between a distinct one of the plurality of paired first and second vias, where the hinges are connected to the substrate at first anchor points corresponding to the first vias and connected to the mirror layer at second anchor points corresponding to the second vias. In some implementations, the plurality of hinges can be symmetrically arranged about the center of the EMS device. In some implementations, each of the hinges can have identical or at least substantially identical hinge lengths. In some implementations, the hinges can support the mirror layer and be suspended over a back surface of the mirror layer, where the hinges can be connected to the mirror layer at the second anchor points.

In some implementations, a top plate can be formed over the second sacrificial layer simultaneous with forming the plurality of hinges. Forming the top plate and the hinges can include depositing a layer of material over the second sacrificial layer as well as in the first vias and the second vias. A second mask can be applied to pattern the layer of material so that hinges are formed to support the mirror layer, and the top plate is formed over the mirror layer. Thus, the top plate may share substantially the same composition and thickness as the plurality of hinges because they can be formed from the same layer or layers of material.

At block 1660, the first sacrificial layer is removed to form a first gap between the mirror layer and the substrate. In some implementations, the second sacrificial layer may be removed simultaneously with the first sacrificial layer to form a second gap between the top plate and the mirror layer. The first sacrificial layer may be removed using any suitable etchant. Upon removal of the first sacrificial layer, the EMS device can be released so that the mirror layer can be movable across the first gap.

Figure 17A:
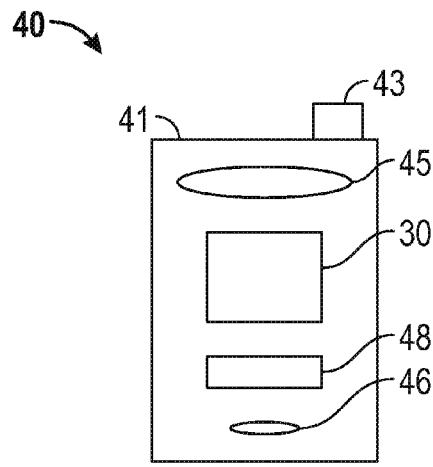
FIGS. 17A and 17B are system block diagrams illustrating a display device that includes a plurality of IMOD display elements.
Figure 17B:
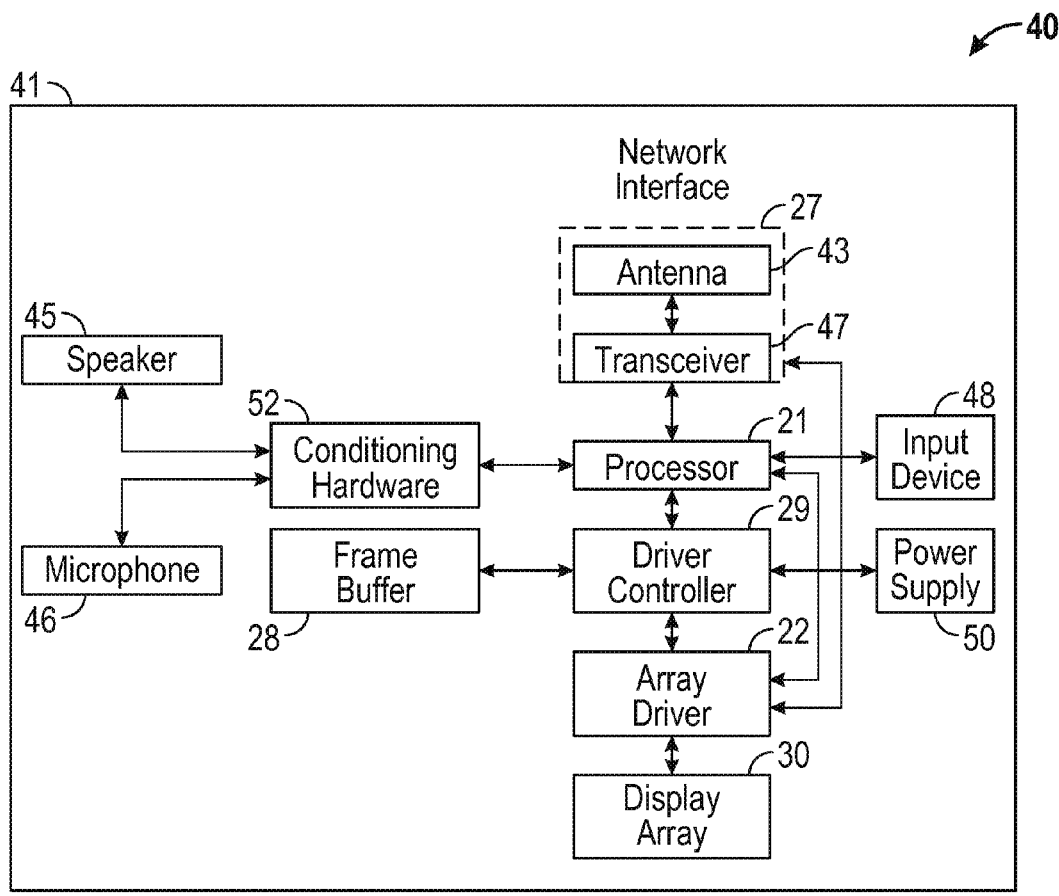

FIGS. 17A and 17B are system block diagrams illustrating a display device 40 that includes a plurality of IMOD display elements. The display device 40 can be, for example, a smart phone, a cellular or mobile telephone. However, the same components of the display device 40 or slight variations thereof are also illustrative of various types of display devices such as televisions, computers, tablets, e-readers, hand-held devices and portable media devices.

The display device 40 includes a housing 41, a display 30, an antenna 43, a speaker 45, an input device 48 and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, EL, OLED, STN LCD, or TFT LCD, or a non-flat-panel display, such as a CRT or other tube device. In addition, the display 30 can include an IMOD-based display, as described herein.

The components of the display device 40 are schematically illustrated in FIG. 17A. The display device 40 includes a housing 41 and can include additional components at least partially enclosed therein. For example, the display device 40 includes a network interface 27 that includes an antenna 43 which can be coupled to a transceiver 47. The network interface 27 may be a source for image data that could be displayed on the display device 40. Accordingly, the network interface 27 is one example of an image source module, but the processor 21 and the input device 48 also may serve as an image source module. The transceiver 47 is connected to a processor 21, which is connected to conditioning hardware 52. The conditioning hardware 52 may be configured to condition a signal (such as filter or otherwise manipulate a signal). The conditioning hardware 52 can be connected to a speaker 45 and a microphone 46. The processor 21 also can be connected to an input device 48 and a driver controller 29. The driver controller 29 can be coupled to a frame buffer 28, and to an array driver 22, which in turn can be coupled to a display array 30. One or more elements in the display device 40, including elements not specifically depicted in FIG. 17A, can be configured to function as a memory device and be configured to communicate with the processor 21. In some implementations, a power supply 50 can provide power to substantially all components in the particular display device 40 design.

The network interface 27 includes the antenna 43 and the transceiver 47 so that the display device 40 can communicate with one or more devices over a network. The network interface 27 also may have some processing capabilities to relieve, for example, data processing requirements of the processor 21. The antenna 43 can transmit and receive signals. In some implementations, the antenna 43 transmits and receives RF signals according to the IEEE 16.11 standard, including IEEE 16.11(a), (b), or (g), or the IEEE 802.11 standard, including IEEE 802.11a, b, g, n, and further implementations thereof. In some other implementations, the antenna 43 transmits and receives RF signals according to the Bluetooth® standard. In the case of a cellular telephone, the antenna 43 can be designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1×EV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G, 4G or 5G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, in some implementations, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that can be readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of display elements.

In some implementations, the driver controller 29, the array driver 22, and the display array 30 are appropriate for any of the types of displays described herein. For example, the driver controller 29 can be a conventional display controller or a bi-stable display controller (such as an IMOD display element controller). Additionally, the array driver 22 can be a conventional driver or a bi-stable display driver (such as an IMOD display element driver). Moreover, the display array 30 can be a conventional display array or a bi-stable display array (such as a display including an array of IMOD display elements). In some implementations, the driver controller 29 can be integrated with the array driver 22. Such an implementation can be useful in highly integrated systems, for example, mobile phones, portable-electronic devices, watches or small-area displays.

In some implementations, the input device 48 can be configured to allow, for example, a user to control the operation of the display device 40. The input device 48 can include a keypad, such as a QWERTY keyboard or a telephone keypad, a button, a switch, a rocker, a touch-sensitive screen, a touch-sensitive screen integrated with the display array 30, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices. For example, the power supply 50 can be a rechargeable battery, such as a nickel-cadmium battery or a lithium-ion battery. In implementations using a rechargeable battery, the rechargeable battery may be chargeable using power coming from, for example, a wall socket or a photovoltaic device or array. Alternatively, the rechargeable battery can be wirelessly chargeable. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm steps described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and steps described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular steps and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of, e.g., an IMOD display element as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, a person having ordinary skill in the art will readily recognize that such operations need not be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. An electromechanical systems (EMS) device comprising:
   a substrate;
   a stationary electrode on the substrate;
   a movable mirror over the stationary electrode and configured to move across a first gap by electrostatic actuation between the movable mirror and the stationary electrode;
   a plurality of first anchor points equally spaced apart and arranged about the center of the movable mirror, the first anchor points providing connection of the EMS device at the substrate;
   a plurality of second anchor points equally spaced apart and arranged about the center of the movable mirror, the second anchor points providing connection of the EMS device at the movable mirror, each of the first anchor points corresponding to at least one of the second anchor points to define a plurality of paired first and second anchor points; and
   a plurality of hinges, each positioned between a distinct one of the plurality of paired first and second anchor points, the plurality of hinges connected to the movable mirror and symmetrically arranged about the center of the EMS device, wherein the movable mirror has a front surface facing the substrate and a back surface opposite the front surface, the plurality of hinges suspended over and connected to the back surface of the movable mirror at the plurality of second anchor points.

2. The device of claim 1, wherein each of the hinges has identical or at least substantially identical hinge lengths.

3. The device of claim 1, wherein each of the plurality of hinges comprises:
   a first metal layer;
   a second metal layer over the first metal layer; and
   a dielectric layer between the first metal layer and the second metal layer.

4. The device of claim 1, further comprising:
   one or more movable posts, each of the movable posts including a protrusion configured to contact the stationary electrode during electrostatic actuation before the movable mirror contacts the stationary electrode, the one or more movable posts having a tapered profile.

5. The device of claim 4, wherein the one or more movable posts are connected to the movable mirror at a periphery of the movable mirror.

6. The device of claim 1, wherein at least part of each of the plurality of hinges and the movable mirror are coplanar.

7. The device of claim 1, further comprising:
   one or more reinforcing layers connecting the hinges to the substrate at the plurality of first anchor points, and connecting the hinges to the movable mirror at the plurality of second anchor points.

8. The device of claim 1, wherein the plurality of hinges are connected to the substrate at the plurality of first anchor points.

9. The device of claim 1, further comprising:
   a top plate over the movable mirror, wherein the top plate and the movable mirror define a second gap therebetween.

10. The device of claim 9, wherein the top plate has substantially the same composition and thickness as the plurality of hinges.

11. The device of claim 9, wherein the movable mirror is configured to move across the second gap by electrostatic actuation between the movable mirror and the top plate.

12. The device of claim 9, further comprising:
    a stiffening layer disposed on the top plate, wherein a thickness of the stiffening layer is greater than a thickness of the top plate.

13. The device of claim 9, further comprising:
    a plurality of smaller hinges connecting the top plate to the substrate at the first anchor points.

14. The device of claim 9, wherein the plurality of hinges are positioned around a periphery of the top plate.

15. The device of claim 1, wherein the plurality of hinges are connected at the second anchor points at the outermost areas of the movable mirror from the center of the movable mirror.

16. The device of claim 1, further comprising:
    a support frame connected to the substrate at the plurality of first anchor points, the support frame around a periphery of the movable mirror.

17. The device of claim 16, wherein the plurality of hinges are connected to the support frame and connected to the back surface of the movable mirror at the plurality of second anchor points.

18. The device of claim 1, wherein the EMS device forms a display in a system, the system further comprising:
    a processor that is configured to communicate with the display, the processor being configured to process image data;
    a memory device that is configured to communicate with the processor;

a driver circuit configured to send at least one signal to the display; and a controller configured to send at least a portion of the image data to the driver circuit;

an image source module configured to send the image data to the processor, wherein the image source module comprises at least one of a receiver, transceiver, and transmitter; and an input device configured to receive input data and to communicate the input data to the processor.

* * * * *